(12) United States Patent
Jiang et al.

(10) Patent No.: US 11,895,933 B2
(45) Date of Patent: Feb. 6, 2024

(54) RESISTIVE MEMORY CELL WITH SWITCHING LAYER COMPRISING ONE OR MORE DOPANTS

(71) Applicant: Taiwan Semiconductor Manufacturing Company, Ltd., Hsin-Chu (TW)

(72) Inventors: Fa-Shen Jiang, Taoyuan (TW); Cheng-Yuan Tsai, Chu-Pei (TW); Hai-Dang Trinh, Hsinchu (TW); Hsing-Lien Lin, Hsin-Chu (TW); Hsun-Chung Kuang, Hsinchu (TW); Bi-Shen Lee, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/855,155

(22) Filed: Jun. 30, 2022

(65) Prior Publication Data

US 2022/0336739 A1 Oct. 20, 2022

Related U.S. Application Data

(62) Division of application No. 16/939,455, filed on Jul. 27, 2020, now Pat. No. 11,430,951.

(Continued)

(51) Int. Cl.
*H10N 70/00* (2023.01)
*H10N 70/20* (2023.01)
*H10B 63/00* (2023.01)

(52) U.S. Cl.
CPC ........... *H10N 70/828* (2023.02); *H10B 63/30* (2023.02); *H10N 70/043* (2023.02);
(Continued)

(58) Field of Classification Search
CPC .. H10N 70/828; H10N 70/043; H10N 70/063; H10N 70/24; H10N 70/8833;
(Continued)

(56) References Cited

U.S. PATENT DOCUMENTS 10,804,464 B2 10/2020 Trinh et al.
2013/0107604 A1 5/2013 Wang et al.
(Continued)

FOREIGN PATENT DOCUMENTS

JP 2019114644 A 7/2019

OTHER PUBLICATIONS

Non-Final Office Action dated Nov. 9, 2021 for U.S. Appl. No. 16/939,455.
(Continued)

*Primary Examiner* — David Vu
(74) *Attorney, Agent, or Firm* — Eschweiler & Potashnik, LLC

(57) ABSTRACT

Various embodiments of the present disclosure are directed towards a method for forming an integrated chip, the method includes forming a bottom electrode over a substrate. A first switching layer is formed on the bottom electrode. The first switching layer comprises a dielectric material doped with a first dopant. A second switching layer is formed over the first switching layer. An atomic percentage of the first dopant in the second switching layer is less than an atomic percentage of the first dopant in the first switching layer. A top electrode is formed over the second switching layer.

20 Claims, 14 Drawing Sheets

Related U.S. Application Data

(60) Provisional application No. 63/014,864, filed on Apr. 24, 2020.

(52) U.S. Cl.
CPC ........... *H10N 70/063* (2023.02); *H10N 70/24* (2023.02); *H10N 70/8833* (2023.02)

(58) Field of Classification Search
CPC .. H10N 70/023; H10N 70/245; H10N 70/826; H10N 70/041; H10N 70/021; H10N 70/841; H10N 70/881; H10B 63/30
See application file for complete search history.

(56) References Cited

U.S. PATENT DOCUMENTS

| | | |
|---|---|---|
| 2013/0250658 A1 | 9/2013 | Wei et al. |
| 2014/0339488 A1 | 11/2014 | Kang |
| 2015/0333257 A1 | 11/2015 | Ramaswamy et al. |
| 2016/0049584 A1 | 2/2016 | Dang et al. |
| 2018/0175292 A1 | 6/2018 | Reid et al. |
| 2018/0277759 A1 | 9/2018 | Tachikawa et al. |
| 2020/0106011 A1 | 4/2020 | Chen et al. |
| 2020/0106013 A1 | 4/2020 | Strutt et al. |
| 2020/0343303 A1 | 10/2020 | Ge et al. |
| 2020/0381624 A1 | 12/2020 | Consiglio et al. |

OTHER PUBLICATIONS

Notice of Allowance dated Apr. 26, 2022 for U.S. Appl. No. 16/939,455.

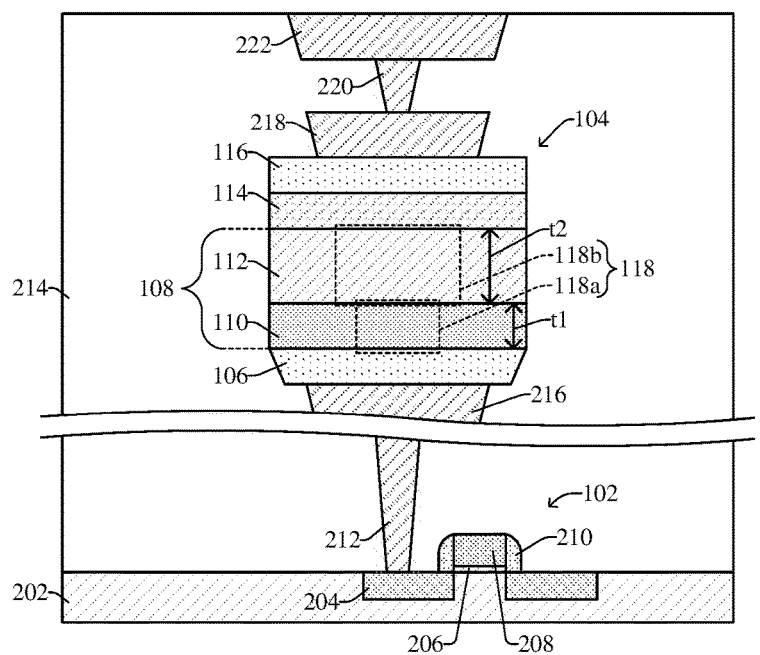
Fig. 2
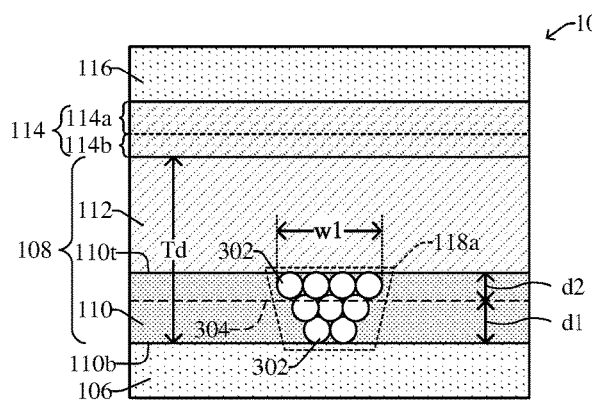 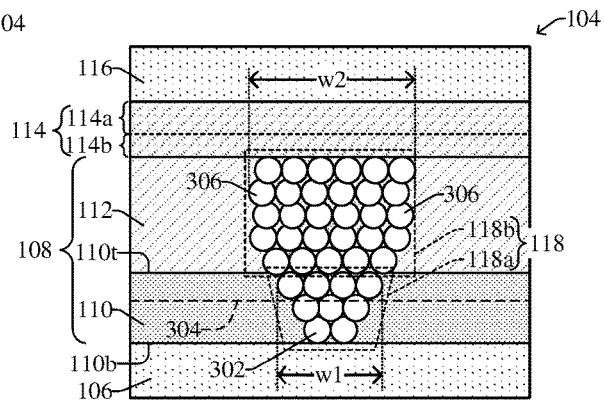
Fig. 3A          Fig. 3B

RESISTIVE MEMORY CELL WITH SWITCHING LAYER COMPRISING ONE OR MORE DOPANTS

REFERENCE TO RELATED APPLICATIONS

This Application is a Divisional of U.S. application Ser. No. 16/939,455, filed on Jul. 27, 2020, which claims the benefit of U.S. Provisional Application No. 63/014,864, filed on Apr. 24, 2020. The contents of the above-referenced Patent Applications are hereby incorporated by reference in their entirety.

BACKGROUND

Many modern electronic devices contain electronic memory configured to store data. Electronic memory may be volatile memory or non-volatile memory. Volatile memory stores data while it is powered, while non-volatile memory is able to keep data when power is removed. Resistive random access memory (RRAM) is one promising candidate for next generation non-volatile memory technology due to its simple structure and compatibility with complementary metal-oxide semiconductor (CMOS) logic processes. An RRAM cell includes a dielectric data storage structure having a variable resistance, which is placed between two electrodes disposed within interconnect metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 illustrates a cross-sectional view of some embodiments of a memory device including a memory cell having a doped lower switching layer.

FIGS. 3A and 3B illustrate cross-sectional views of some embodiments of a memory cell including a doped lower switching layer.

DETAILED DESCRIPTION

Figure 1:
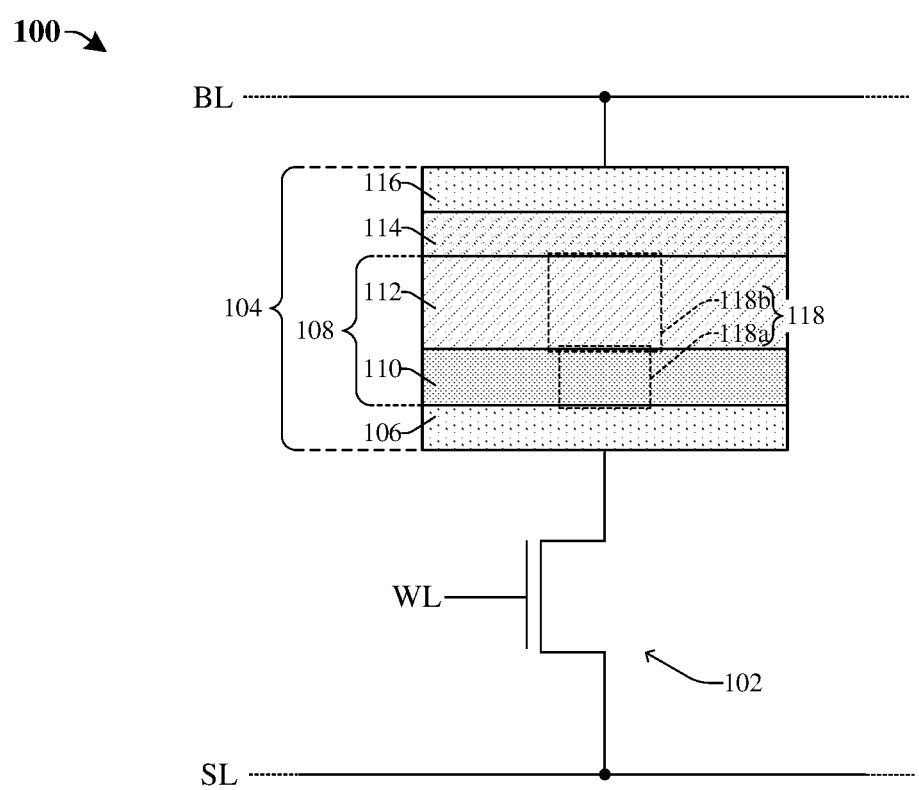
FIG. 1 illustrates a schematic view of some embodiments of a memory device including a memory cell having a low forming voltage.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random access memory (RRAM) cell includes a data storage structure (e.g., one or more oxide layer(s)) arranged between a top electrode and a bottom electrode. The RRAM cell is disposed over a semiconductor substrate. A variable resistance of the data storage structure represents a data unit, such as a bit of data. Depending on a voltage applied between the top and bottom electrodes, the variable resistance undergoes a reversible change between a high resistance state and a low resistance state corresponding to data states of the data unit. The high resistance state is high in that the variable resistance exceeds a threshold, and the low resistance state is low in that the variable resistance is below the threshold.

Before an RRAM cell can be used to store data, an initial conductive path (i.e., conductive filament) is typically formed across the data storage structure. Formation of the initial conductive path makes subsequent write operations (that form the conductive path) easier to perform. To form the initial conductive path, at the end of the RRAM manufacturing process a forming voltage is applied across the top and bottom electrodes. In some types of RRAM cells, the conductive path may include vacancies (e.g., oxygen vacancies). In such devices the forming voltage may break bonds between oxygen atoms and metal atoms in the data storage structure, thereby knocking oxygen atoms out of a lattice of the data storage structure and forming localized oxygen vacancies. These localized oxygen vacancies tend to align to form the conductive path which extends through the data storage structure. Thereafter, set or reset voltages can be applied across the top and bottom electrodes to change resistivity of the data storage structure between the high resistance state and the low resistance state. Generally, the forming voltage is greater than the set voltage. Typically, one or more transistors (e.g., a metal-oxide-semiconductor field-effect transistor (MOSFET)) disposed on/over the semiconductor substrate provide voltages to the RRAM cell, such that the forming voltage, the set voltage, and the reset voltage may be applied across the top electrode and the bottom electrode.

In some embodiments in which the conductive path is formed before the RRAM cell is used to store data, the data storage structure may be or comprise an undoped metal oxide structure (e.g., undoped hafnium oxide ($HfO_x$)). In such embodiments, the conductive path may not be confined to a specific region of the data storage structure, such that the conductive path forms randomly in the data storage structure. Further, in order to break a sufficient number of bonds between the oxygen and metal atoms the forming voltage may be relatively high. However, as the feature sizes of the one or more transistors are scaled down, the relatively high forming voltage becomes problematic (e.g., due to the reduced feature sizes of the one or more transistors reducing breakdown voltages). The relatively high forming voltage may be greater than a safe output voltage of the one or more transistors. Accordingly, if the one or more transistors are operated to output the relatively high forming voltage, the one or more transistors may be damaged and/or destroyed.

The present application, in some embodiments, is directed towards a memory cell that comprises a data storage structure having a lower switching layer doped with a first dopant and having a low forming voltage. The memory cell further includes a top electrode and a bottom electrode, where the data storage structure is disposed between the top and bottom electrodes. The data storage structure has an upper switching layer over the lower switching layer. The upper and lower switching layers each comprise a dielectric material (e.g., hafnium oxide ($HfO_2$), aluminum oxide ($Al_2O_3$), etc.), and the lower switching layer is doped with the first dopant (e.g., hydrogen). The first dopant is highly reactive with oxygen, such that during fabrication of the lower switching layer the first dopant may break bonds between the metal and oxygen atoms in the lower switching layer. This results in formation of intrinsic oxygen vacancies that may align with one another to form one or more intrinsic conductive paths in the lower switching layer. Thus, the lower switching layer comprises one or more intrinsic conductive paths that are formed without applying the forming voltage across the memory cell. Further, the intrinsic conductive paths may serve as a conductive path seed to form upper conductive paths in the upper switching layer during a subsequent forming operation. Because the intrinsic oxygen vacancies are formed before performing the forming operation on the memory cell, a number of localized oxygen vacancies formed by the forming operation is reduced. This, in part, reduces a magnitude of the forming voltage and/or a duration of the forming operation, thereby reducing a power consumption of the memory cell and increasing a number of set and reset operations that may be performed on the memory cell.

In addition, the lower switching layer can be co-doped with the first dopant and a second dopant (e.g., nitrogen), the second dopant may occupy a space adjacent to the intrinsic oxygen vacancies, thereby confining the intrinsic conductive paths to one or more regions of the lower switching layer (e.g., a center region of the lower switching layer). This may prevent degradation of the intrinsic conductive paths during operation of the memory cell, thereby increasing an endurance and stability of the memory cell. Accordingly, an integrated chip comprising the memory cell may have one or more transistor(s) with scaled down feature sizes that can safely provide the reduced forming voltage to the memory cell. This facilitates shrinking the feature sizes of the memory cell and the one or more transistor(s) while mitigating and/or eliminating damage to the memory cell and/or the one or more transistors(s).

FIG. 1 illustrates a schematic view of some embodiments of a memory device 100 including a memory cell 104 having a low forming voltage.

The memory device 100 includes the memory cell 104 electrically coupled to a transistor 102, such that the memory device 100 is in a one transistor-one resistive memory cell (1T1R) configuration. In some embodiments, the transistor 102 may, for example, be a metal-oxide-semiconductor field-effect transistor (MOSFET). The memory cell 104 includes a bottom electrode 106, a top electrode 116, a capping layer 114, and a data storage structure 108 disposed between the bottom electrode 106 and the capping layer 114. In alternative embodiments, the capping layer 114 is omitted. A bit line (BL) is electrically coupled to one end of the data storage structure 108 through the top electrode 116, and a source line (SL) is electrically coupled to an opposite end of the data storage structure 108 by way of the transistor 102. A word line (WL) is electrically coupled to a gate electrode of the transistor 102. Thus, application of a suitable WL voltage to the gate electrode of the transistor 102 couples the memory cell 104 between the BL and the SL. Consequently, in some embodiments, by providing suitable bias conditions, the memory cell 104 can be switched between two states of electrical resistance, a low resistance state and a high resistance state, to store data.

In some embodiments, the data storage structure 108 comprises a lower switching layer 110 and an upper switching layer 112 that each comprise a dielectric material. The dielectric material may, for example, be or comprise a metal oxide (e.g., hafnium oxide ($HfO_2$), tantalum oxide ($Ta_2O_5$), aluminum oxide ($Al_2O_3$), etc.). Further, the lower switching layer 110 is doped with a first dopant. In some embodiments, the first dopant may be or comprise hydrogen. It will be appreciated that the first dopant comprising another element is within the scope of the disclosure. Thus, in various embodiments, the lower switching layer 110 comprises the dielectric material (e.g., $HfO_2$, $Ta_2O_5$, $Al_2O_3$, etc.) and hydrogen. In further embodiments, between about 1.5 to 30 percent of a chemical composition of the lower switching layer 110 is the first dopant (e.g., hydrogen). It will be appreciated that the lower switching layer 110 comprising other chemical composition percentages of the first dopant is also within the scope of the disclosure. In various embodiments, the lower switching layer 110 consists of or consists essentially of the dielectric material (e.g., $HfO_2$, $Ta_2O_5$, $Al_2O_3$, etc.) and the first dopant, such that the lower switching layer 110 is devoid of another dopant.

In yet further embodiments, the lower switching layer 110 is co-doped with the first dopant and a second dopant. In some embodiments, the second dopant may be or comprise nitrogen, such that the second dopant is different from the first dopant. It will be appreciated that the second dopant comprising another element is within the scope of the disclosure. In some embodiments, the lower switching layer 110 consists of or consists essentially of the dielectric material (e.g., $HfO_2$, $Ta_2O_5$, $Al_2O_3$, etc.), the first dopant, and the second dopant. In various embodiments, between about 3 to 20 percent of a chemical composition of the lower switching layer 110 is the second dopant (e.g., nitrogen). It will be appreciated that the lower switching layer 110 comprising other chemical composition percentages of the second dopant is also within the scope of the disclosure. When the lower switching layer 110 is co-doped with the first and second dopants, then the chemical composition percentage of the first dopant is, for example, less than the chemical composition percentage of the second dopant within the lower switching layer 110. In such embodiments, between about 1.5 to 10 percent of the chemical composition of the lower switching layer 110 is the first dopant. The memory cell 104 can be configured as a resistive random access (RRAM) cell, such that the data storage structure 108 comprises material(s) having a variable resistance configured to undergo a reversible phase change between a high resistance state and a low resistance state.

In some embodiments, before the memory cell 104 may be used to store data, an initial conductive path (i.e., initial conductive filament) is typically formed within a region 118 across the data storage structure 108. The region 118 includes a first region 118a disposed within the lower switching layer 110 and a second region 118b disposed within the upper switching layer 112. Formation of the initial conductive path makes subsequent write operations (that form the conductive path) easier to perform. The initial conductive path comprises oxygen vacancies that are disposed within the region 118 and extend from a top surface of the bottom electrode 106 to a bottom surface of the capping layer 114.

The first dopant (e.g., hydrogen) is highly reactive with oxygen, such that during fabrication of the lower switching layer 110 the first dopant may break bonds between metal and oxygen atoms in the lower switching layer 110. This results in a formation of intrinsic oxygen vacancies that can align with one another to form an intrinsic conductive path (i.e., an intrinsic conductive filament) in a first region 118a of the lower switching layer 110. Further, after fabrication of the memory cell 104, a forming operation is performed on the memory cell 104. The forming operation includes applying a forming voltage across the top electrode 116 and the bottom electrode 106 by the transistor 102 and the BL. This results in formation of oxygen vacancies within the upper switching layer 112 that tend to align with one another to form an upper initial conductive path (i.e., an upper initial conductive filament) within the second region 118b of the upper switching layer 112. Thus, the initial conductive path includes the intrinsic conductive path in the first region 118a and the upper initial conductive path in the second region 118b. Thereafter, set or reset voltages can be applied across the bottom and top electrodes 106, 116 by way of the transistor 102 and the BL, to change resistivity of the data storage structure 108 between the high resistance state and the low resistance state.

In various embodiments, the intrinsic conductive path within the lower switching layer 110 may serve as a conductive path seed for forming the upper initial conductive path within the upper switching layer 112. This results in the upper initial conductive path being aligned with the intrinsic conductive path. Further, because the intrinsic conductive path is formed before performing the forming operation on the memory cell 104, a number of oxygen vacancies formed by the forming operation is reduced. This, in part, reduces a magnitude of the forming voltage and/or a duration of applying the forming voltage across the memory cell 104, thereby reducing a power consumption of the memory cell 104. In addition, the second dopant (e.g., nitrogen) may occupy a space adjacent to the intrinsic oxygen vacancies of the upper switching layer 112, thereby confining the intrinsic conductive path to the first region 118a. This, in part, increases an endurance and/or a stability of the memory cell 104 while performing the forming operation, a set operation, and/or a reset operation. Thus, by virtue of the lower switching layer 110 comprising the first dopant and the second dopant, the forming voltage may be reduced, thereby facilitating a reduction in feature sizes of the transistor 102 and/or the memory cell 104.

FIG. 2 illustrates a cross-sectional view of some embodiments of a memory device 200 including the memory cell 104 disposed over a substrate 202.

The memory device 200 includes an interconnect dielectric structure 214 overlying the substrate 202. In some embodiments, the substrate 202 may, for example, be or comprise a semiconductor body such as monocrystalline silicon/CMOS bulk, silicon-germanium (SiGe), a silicon-on-insulator (SOI), or another suitable semiconductor substrate material. Further, in some embodiments, the substrate 202 may, for example, comprise a first doping type (e.g., p-type). The transistor 102 is disposed within/over the substrate 202. In some embodiments, the transistor 102 may, for example, be or comprise a metal oxide semiconductor field effect transistor (MOSFET), a high voltage transistor, a bipolar junction transistor (BJT), an n-channel metal oxide semiconductor (nMOS) transistor, a p-channel metal oxide semiconductor (pMOS) transistor, a gate-all-around FET (GAAFET), a gate-surrounding FET, a multi-bridge channel FET (MBCFET), a nanowire FET, a nanoring FET, a nanosheet field-effect transistor (NSFET), or the like. It will be appreciated that the transistor 102 being configured as another semiconductor device is also within the scope of the disclosure. In further embodiments, the transistor 102 may include source/drain regions 204, a gate dielectric layer 206, a gate electrode 208, and/or a sidewall spacer structure 210. The source/drain regions 204 may be disposed within the substrate 202 and/or may comprise a second doping type (e.g., n-type) opposite the first doping type.

A lower conductive via 212 is disposed within the interconnect dielectric structure 214 and overlies a source/drain region 204 of the transistor 102. In some embodiments, the interconnect dielectric structure 214 may, for example, be or comprise one or more inter-metal dielectric (IMD) layers. The one or more IMD layers may, for example, respectively be or comprise silicon dioxide, a low κ dielectric material, an extreme low κ dielectric material, another suitable dielectric material, or a combination of the foregoing. As used herein, a low κ dielectric material may be or comprise, for example, a dielectric material with a dielectric constant κ less than approximately 3.9, 3, 2, or 1. A lower conductive wire 216 is disposed within the interconnect dielectric structure 214 and overlies the lower conductive via 212. An upper conductive wire 218 overlies the lower conductive wire 216. In some embodiments, the lower conductive wire 216 is configured as a bottom electrode via and the upper conductive wire is configured as a top electrode via. The memory cell 104 is disposed within the interconnect dielectric structure 214 and is vertically between the lower conductive wire 216 and the upper conductive wire 218. An upper conductive via 220 overlies the upper conductive wire 218, and a second upper conductive wire 222 overlies the upper conductive via 220. In some embodiments, the lower conductive via 212, the upper conductive via 220, and the second upper conductive wire 222 may, for example, each be or comprise ruthenium, copper, aluminum, tungsten, another conductive material, or any combination of the foregoing.

The memory cell 104 includes the bottom electrode 106, the top electrode 116, the capping layer 114, and the data storage structure 108 disposed between the bottom electrode 106 and the capping layer 114. The data storage structure 108 includes a lower switching layer 110 and an upper switching layer 112 overlying the lower switching layer 110. During operation, the memory cell 104 relies on redox reactions to form and dissolve at least a portion of a conductive path in the region 118 of the data storage structure 108 between the bottom electrode 106 and the capping layer 114. For example, the region 118 includes a first region 118a disposed in the lower switching layer 110 and a second region 118b disposed in the upper switching layer 112. The existence of a conductive path across the data storage structure 108 in the region 118 produces a low resistance state, while the absence of at least a portion of the conductive path in the region 118 produces a high resistance state. In some embodiments, the first region 118a comprises the intrinsic conductive path and the second region 118b comprises an upper conductive path (e.g., as described in FIG. 1), such that the conductive path includes the intrinsic conductive path and the upper conductive path extending across the region 118 of the data storage structure 108. In such embodiments, the memory cell 104 may be configured to form or dissolve the upper conductive path within the second region 118b of the upper switching layer 112 (e.g., see FIG. 3B). Thus, the memory cell 104 can be switched between the high resistance state and the low resistance state by applying appropriate biases to the memory cell 104 to produce or dissolve at least a portion of the conductive path in the region 118.

The lower switching layer 110 and the upper switching layer 112 each comprise a dielectric material. The dielectric material may, for example, be or comprise a high κ dielectric material, hafnium oxide ($HfO_2$), zirconium oxide ($ZrO_2$), aluminum oxide ($Al_2O_3$), tantalum oxide ($Ta_2O_5$), hafnium aluminum oxide (HfAlO), hafnium zirconium oxide (HfZrO), silicon dioxide ($SiO_2$), another dielectric material, or any combination of the foregoing. As used herein, a high κ dielectric material may, for example, be or comprise a dielectric material with a dielectric constant κ greater than approximately 3.9, 9.34, 9.9, or 11.54. Further, the lower switching layer 110 is doped with a first dopant, or is co-doped with the first dopant and a second dopant, where the first dopant is different than the second dopant. In some embodiments, the first dopant may be or comprise hydrogen or another suitable element. In yet further embodiments, the second dopant may be or comprise nitrogen or another suitable element. In further embodiments, the first dopant (e.g., hydrogen) is configured to reduce a forming voltage of the memory cell 104 and the second dopant (e.g., nitrogen) is configured to further reduce the forming voltage and/or increase an endurance of the memory cell 104. In yet further embodiments, the upper switching layer 112 may be or comprise the dielectric material devoid of the first dopant and/or the second dopant, such that the upper switching layer 112 comprises an undoped dielectric material. In such embodiments, the undoped dielectric material may be or comprise an undoped high κ dielectric material, undoped hafnium oxide ($HfO_2$), undoped zirconium oxide ($ZrO_2$), undoped aluminum oxide ($Al_2O_3$), undoped tantalum oxide ($Ta_2O_5$), undoped hafnium aluminum oxide (HfAlO), undoped hafnium zirconium oxide (HfZrO), undoped silicon dioxide ($SiO_2$), another dielectric material, or any combination of the foregoing.

In various embodiments, between about 1.5 to 30 percent of a chemical composition of the lower switching layer 110 is the first dopant (e.g., hydrogen). It will be appreciated that the lower switching layer 110 comprising other chemical composition percentages of the first dopant is also within the scope of the disclosure. In some embodiments, if the first dopant is a relatively low percent (e.g., less than about 1.5 percent) of the chemical composition of the lower switching layer 110, then the forming voltage of the memory cell 104 may not be reduced. In further embodiments, if the first dopant is a relatively high percent (e.g., greater than about 30 percent) of the chemical composition of the lower switching layer 110, then the lower switching layer 110 may comprise a relatively large number of intrinsic oxygen vacancies, thereby increasing a magnitude of the reset voltage used to switch the memory cell 104 from the low resistance state to the high resistance state. This may reduce discrete data states of the memory cell 104.

Further, in some embodiments, the lower switching layer is co-doped within the first and second dopants, such that between about 3 to 20 percent of a chemical composition of the lower switching layer 110 is the second dopant (e.g., nitrogen). It will be appreciated that the lower switching layer 110 comprising other chemical composition percentages of the second dopant is also within the scope of the disclosure. In various embodiments, if the second dopant is a relatively low percent (e.g., less than about 3 percent) of the chemical composition of the lower switching layer 110, then an endurance of the memory cell 104 may not be sufficiently increased and/or the forming voltage of the memory cell 104 may not be sufficiently reduced. In yet further embodiments, if the second dopant is a relatively high percent (e.g., greater than about 20 percent) of the chemical composition of the lower switching layer 110, then an endurance of the memory cell 104 may be reduced, thereby decreasing a number of set and/or reset operations that may be performed on the memory cell 104.

The lower switching layer 110 may, for example, comprise a first atomic percentage of the first dopant (e.g., hydrogen) and a second atomic percentage of the second dopant (e.g., nitrogen). In some embodiments, the first atomic percentage is about 1.5 percent, 5 percent, 10 percent, 15 percent, 20 percent, 25 percent, 30 percent, within a range of about 3 to 10 percent, within a range of about 1.5 to 30 percent, or another suitable value. In further embodiments, the second atomic percentage is about 3 percent, 5 percent, 10 percent, 15 percent, 20 percent, within a range of about 3 to 20 percent, or another suitable value. In yet further embodiments, when the lower switching layer 110 is co-doped with the first and second dopants, then the first atomic percentage is less than the second atomic percentage, for example the first atomic percentage may be about 10 percent and the second atomic percentage may be about 20 percent. In such embodiments, a ratio of the second atomic percentage to the first atomic percentage may be about 2:1, 3:1, 4:1, 5:1, or another suitable value. In various embodiments, a sum of the first atomic percentage and the second atomic percentage is within a range of about 1.5 to 30 percent.

The lower switching layer 110 has a thickness t1 and the upper switching layer 112 has a thickness t2. In some embodiments, the thickness t1 is about 1.5 nanometers (nm), 1.75 nm, 2 nm, within a range of about 1.5 to 2 nm, or another suitable thickness value. In further embodiments, if the thickness t1 is relatively small (e.g., less than about 1.5 nm), then a forming voltage of the memory cell 104 may not be sufficiently reduced. This, in part, is because the intrinsic conductive path(s) within the lower switching layer 110 may be relatively small and may not serve as suitable conductive path seed(s) for the upper conductive path(s) in the upper switching layer 112. In yet further embodiments, if the thickness t1 is relatively large (e.g., greater than about 2 nm), then intrinsic conductive path(s) may not extend continuously from a bottom surface to a top surface of the lower switching layer 110. In various embodiments, the thickness t2 is about 2 nm, 2.25 nm, 2.5 nm, 2.75 nm, 3 nm, within a range of about 2 to 3 nm, or another suitable thickness value. In some embodiments, if the thickness t2 is relatively small (e.g., less than about 2 nm), then high leakage current may occur between the bottom electrode 106 and the capping layer 114. In yet further embodiments, if the thickness t2 is relatively large (e.g., greater than about 3 nm), then a forming voltage of the memory cell 104 may be increased. In some embodiments, the thickness t1 of the lower switching layer 110 is less than the thickness t2 of the upper switching layer 112.

In some embodiments, the memory cell 104 may be configured as a resistive random access memory (RRAM) cell, a programmable metallization cell (PMC), a metal-cation RRAM cell, or the like. In some embodiments, the lower and/or upper conductive wires 216, 218 may, for example, respectively be or comprise copper, aluminum, tungsten, another conductive material, or any combination of the foregoing. In an embodiment, where the memory cell 104 is configured as an RRAM cell, then the capping layer 114 may be or comprise tantalum, tantalum nitride, titanium, titanium nitride, hafnium, zirconium, another conductive material, or any combination of the foregoing. In another embodiments, where the memory cell 104 is configured as a programmable metallization cell, such as conductive bridging RAM (CBRAM), then the capping layer 114 may be or comprise copper, gold, silver, tellurium, copper tellurium, aluminum, aluminum nitride, an alloy of the foregoing, another conductive material, or any combination of the foregoing. In yet further embodiments, the bottom and top electrodes 106, 116 may, for example, respectively be or comprise titanium, tantalum, titanium nitride, tantalum nitride, platinum, nickel, hafnium, zirconium, ruthenium, iridium, another conductive material, or any combination of the foregoing.

In yet further embodiments, the lower switching layer 110 may be or comprise a stack of switching layers (not shown) that each comprise a dielectric material (e.g., a high κ dielectric material, hafnium oxide ($HfO_2$), zirconium oxide ($ZrO_2$), aluminum oxide ($Al_2O_3$), tantalum oxide ($Ta_2O_5$), hafnium aluminum oxide (HfAlO), hafnium zirconium oxide (HfZrO), silicon dioxide ($SiO_2$), etc.) doped with the first dopant, or co-doped with the first dopant and the second dopant. In such embodiments, each switching layer with the stack of switching layers comprises the first dopant (e.g., hydrogen) and one or more intrinsic conductive paths.

FIGS. 3A and 3B illustrate cross-sectional views of some embodiments of different states of the memory cell 104 of FIGS. 1 and/or 2 of the memory cell 104. In some embodiments, FIG. 3A illustrates a first state 300a, in which the memory cell is in a high resistance state (e.g., storing a logical "0"). In further embodiments, FIG. 3B illustrates a second state 300b, in which the memory cell 104 is in a low resistance state (e.g., storing a logical "1"). Although FIGS. 3A and 3B describe a memory cell as having a conductive path formed of oxygen vacancies, it will be appreciated that the disclosed data storage structure 108 is not limited to a memory cell having such paths. For example, in some embodiments, the data storage structure 108 may be used in memory devices having a conductive path that is formed of conductive ions and oxygen vacancies or formed of conductive ions and not oxygen vacancies.

FIG. 3A illustrates one embodiment of the first state 300a of the memory cell 104, in which a forming operation and/or a set operation have not been performed on the memory cell 104. The memory cell 104 includes the bottom electrode 106, the lower switching layer 110, the upper switching layer 112, the capping layer 114, and the top electrode 116 (e.g., as illustrated and/or described in FIGS. 1 and/or 2). In some embodiments, the capping layer 114 includes a metal layer 114a comprising a metal material (e.g., tantalum, tantalum nitride, titanium, titanium nitride, hafnium, zirconium, or the like) overlying a metal oxide layer 114b comprising a metal oxide (e.g., an oxide of the metal material).

In some embodiments, after fabricating the memory cell 104 and before performing a forming and/or set operation on the memory cell 104, the lower switching layer 110 comprises a plurality of intrinsic oxygen vacancies 302 disposed within a first region 118a of the lower switching layer 110. In such embodiments, during fabrication of the memory cell 104, the lower switching layer 110 is doped with a first dopant (e.g., hydrogen ($H^+$)) that is highly reactive with oxygen. In such embodiments, the first dopant is configured to break bonds between the metal atoms and oxygen atoms in the lower switching layer 110, thereby forming a compound of oxygen and the first dopant (e.g., hydroxide ($OH^-$)) and intrinsic oxygen vacancies 302 within the lower switching layer 110. The intrinsic oxygen vacancies 302 tend to align with one another to form one or more intrinsic conductive paths (i.e., intrinsic conductive filaments) in one or more regions of the lower switching layer 110 (e.g., the first region 118a). The one or more intrinsic conductive paths extend continuously from a bottom surface 110b of the lower switching layer 110 to a top surface 110t of the lower switching layer 110. In various embodiments, the one or more intrinsic conductive paths may serve as conductive path seed(s) for upper conductive path(s) formed within the upper switching layer 112 during a subsequent forming and/or set operation (e.g., see FIG. 3B). This, in part, decreases the forming voltage and/or increases a number of set/reset operations that may be performed on the memory cell 104.

In addition, the data storage structure 108 has a thickness Td. In some embodiments, the thickness Td is within a range of about 3.5 to 5 nm. It will be appreciated that the thickness Td having other values is within the scope of the disclosure. A location of a peak of a concentration of the first dopant (e.g., hydrogen) and/or the second dopant (e.g., nitrogen) within the lower switching layer 110 may be represented by the horizontal line 304, where the horizontal line 304 is parallel to the bottom surface 110b of the lower switching layer 110. In some embodiments, a first distance d1 between the horizontal line 304 and the bottom surface 110b of the lower switching layer 110 is within a range of about 5 to 40 percent of the thickness Td (e.g., 0.05*Td to 0.4*Td). It will be appreciated that the first distance d1 having another value is within the scope of the disclosure. In further embodiments, a second distance d2 between the horizontal line 304 and the top surface 110t of the lower switching layer 110 is less than the first distance d1. In yet further embodiments, the concentration of the first dopant and/or second dopant may continuously increase from the top surface 110t of the lower switching layer 110 to the horizontal line 304, and the concentration of the first dopant and/or second dopant may continuously decrease from the horizontal line 304 to the bottom surface 110b of the lower switching layer 110. Thus, in some embodiments, the peak of the concentration of the first and/or second dopants is closer to a bottom surface of the upper switching layer 112 than a top surface of the bottom electrode 106 (e.g., see FIG. 3C), such that a width w1 of the intrinsic conductive path may increase from the bottom surface 110b of the lower switching layer 110 to the top surface 110t of the lower switching layer. This, in turn, facilities the intrinsic conductive path serving as a conductive path seed for the upper conductive path during the subsequent forming and/or set operation (e.g., see FIG. 3B).

In various embodiments, the lower switching layer 110 is co-doped with the first dopant and the second dopant, where the second dopant (e.g., nitrogen) is configured to couple to the intrinsic oxygen vacancies 302, thereby occupying a space directly adjacent to the intrinsic oxygen vacancies 302. This may facilitate confining the intrinsic conductive path to the first region 118a and mitigates dissolving the intrinsic conductive path in a subsequent reset operation. Thus, the second dopant may further decrease the forming voltage and/or increase an endurance and stability of the memory cell 104.

FIG. 3B illustrates one embodiment of the second state 300b of the memory cell 104, in which the forming operation was performed on the memory cell 104. In some embodiments, during the forming operation, a forming voltage is applied across the bottom and top electrodes 106, 116. In such embodiments, the forming voltage is configured to knock oxygen atoms out of a lattice of the upper switching layer 112 (and/or the lower switching layer 110), and the metal oxide layer 114b is configured to receive the oxygen atoms, thereby forming oxygen vacancies 306 in the upper switching layer 112. In some embodiments, the intrinsic oxygen vacancies 302 within the lower switching layer 110 may serve as a conductive path seed, such that the oxygen vacancies 306 tend to align within the second region 118b, directly above the first region 118a, to form an upper conductive path (i.e., upper conductive filament) within the upper switching layer 112. The intrinsic conductive path within the first region 118a and the upper conductive path within the second region 118b define a conductive path (i.e., an initial conductive path) which extends through the data storage structure 108 from the bottom electrode 106 to the capping layer 114. Thus, after the forming operation, the memory cell 104 is in a low resistance state (e.g., storing a logical "1"). Thereafter, reset or set voltages can be applied across the bottom and top electrodes 106, 116 to dissolve and/or form the upper conductive path within the second region 118b of the upper switching layer 112. In some embodiments, a width w2 of the upper conductive path within the second region 118b is greater than the width w1 of the intrinsic conductive path within the first region 118a.

In some embodiments, by virtue of the lower switching layer 110 comprising the first dopant (e.g., hydrogen) and the second dopant (e.g., nitrogen), the forming voltage may be reduced and/or eliminated. In some embodiments, as an atomic percentage of the first and/or second dopants in the lower switching layer 110 increases, the forming voltage decreases. For example, as the atomic percentage of the first and/or second dopants is increased, the forming voltage may be decreased from about 2.75 volts (V) to 2.44 V. It will be appreciated that the forming voltage having other values is within the scope of the disclosure. In various embodiments, the forming voltage may be approximately equal to a set voltage of the memory cell 104, such that the forming process is eliminated and a set operation is performed on the memory cell 104 to achieve the second state 300b. This in turn decreases a power consumption of the memory cell 104 and facilitates shrinking feature sizes of the memory cell 104 while mitigating damage to the memory cell 104.

In yet further embodiments, after applying the forming voltage or the set voltage across the memory cell 104, the compound of oxygen and the first dopant (e.g., hydroxide (OH$^-$)) within the lower switching layer 110 may migrate to the metal oxide layer 114b of the capping layer 114. Subsequently, applying a reset voltage across the memory cell 104 may knock the oxygen atoms and/or the compound (e.g., hydroxide (OH$^-$)) from the metal oxide layer 114b to the upper switching layer 112 and/or the lower switching layer 110. This dissolves at least a portion of the upper conductive path within the upper switching layer 112 such that the memory cell 104 is in a high resistance state (e.g., storing a logical "0"). In some embodiments, after applying the reset voltage, the compound (e.g., hydroxide (OH$^-$)) may be disposed within the upper switching layer 112 such that the upper switching layer 112 comprises the first dopant. In various embodiments, an atomic percentage of the first dopant (e.g., hydrogen) within the upper switching layer 112 is less than an atomic percentage of the first dopant within the lower switching layer 110.

In some embodiments, the memory cell 104 is toggled between the high resistance state (FIG. 3A) and the low resistance state (FIG. 3B). This switching process includes applying the set voltage to achieve the low resistance state. Referring to FIG. 3B, the set voltage will form the upper conductive path within the second region 118b. Then, the reset voltage is applied to the memory cell 104, removing the upper conductive path within the second region 118b, leaving only the intrinsic conductive path within the first region 118a, and switching the memory cell 104 to a high resistance state (FIG. 3A). This process can be repeated as many times as desired. Switching time is reduced compared to conventional resistive memory cells because the intrinsic conductive path is present in the high resistance state and the low resistance state. Further, by virtue of the lower switching layer 110 comprising the intrinsic conductive path within the first region 118a a size (e.g., a height) of the upper conductive path within the second region 118b is reduced (e.g., compared to conventional resistive memory cells). Because the size of the upper conductive path is reduced, magnitudes of the set and reset voltages used to form and dissolve the upper conductive path is reduced. The reduction of the magnitudes of the set and reset voltages increases a number of switching operations that can be performed on the memory cell 104. This may decrease a bit error rate (BER) across a plurality of memory cells that each comprises the lower and upper switching layers 110, 112.

Figure 3C:
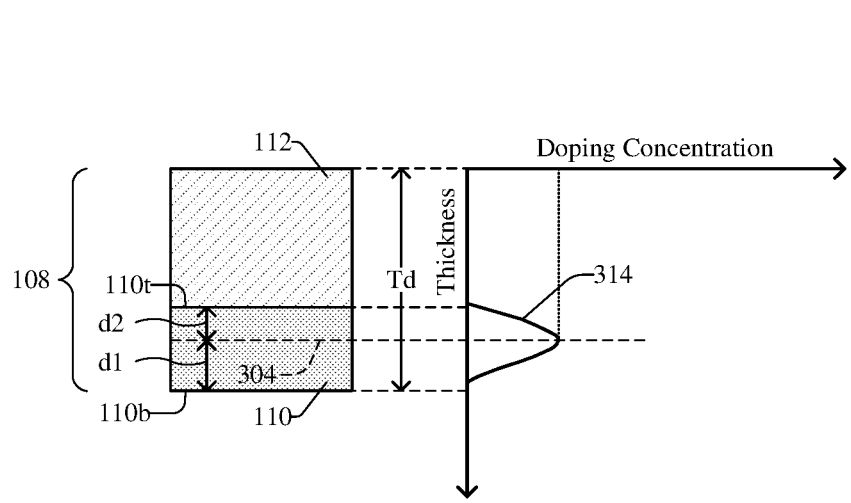
FIG. 3C illustrates a graph corresponding to some embodiments of a concentration of dopant(s) within the doped lower switching layer of FIGS. 1-3B.

FIG. 3C illustrates a graph 300c corresponding to some embodiments of a doping profile of one or more dopants across the thickness Td of the data storage structure 108 of FIGS. 1-3B. The y-axis of the graph 300c corresponds to a thickness of the data storage structure 108. The x-axis of the graph 300c corresponds to a doping concentration of a first dopant (e.g., hydrogen) or a doping concentration of the first dopant and the second dopant (e.g., nitrogen) within the data storage structure 108.

A doping concentration curve 314 relates to some embodiments of a doping concentration of one or more dopants (e.g., the first dopant or the first and second dopants) within the data storage structure 108. As can be seen by the curve 314, the doping concentration of the one or more dopants continuously increases from a top surface 110t of the lower switching layer 110 to the horizontal line 304, and continuously decreases from the horizontal line 304 in a direction towards the bottom surface 110b of the lower switching layer 110. Thus, in some embodiments, a doping profile of the first dopant or the first and second dopants within the data storage structure 108 follows a Gaussian distribution. It will be appreciated that the doping profile of the first dopant or the first and second dopants within the data storage structure 108 having another distribution is within the scope of the disclosure. A peak of the doping concertation of the one or more dopants is disposed along the horizontal line 304. Thus, as illustrated by the curve 314, the peak of the doping concentration is closer to the top surface 110t of the lower switching layer 110 than to the bottom surface 110b of the lower switching layer 110.

Figure 4A:
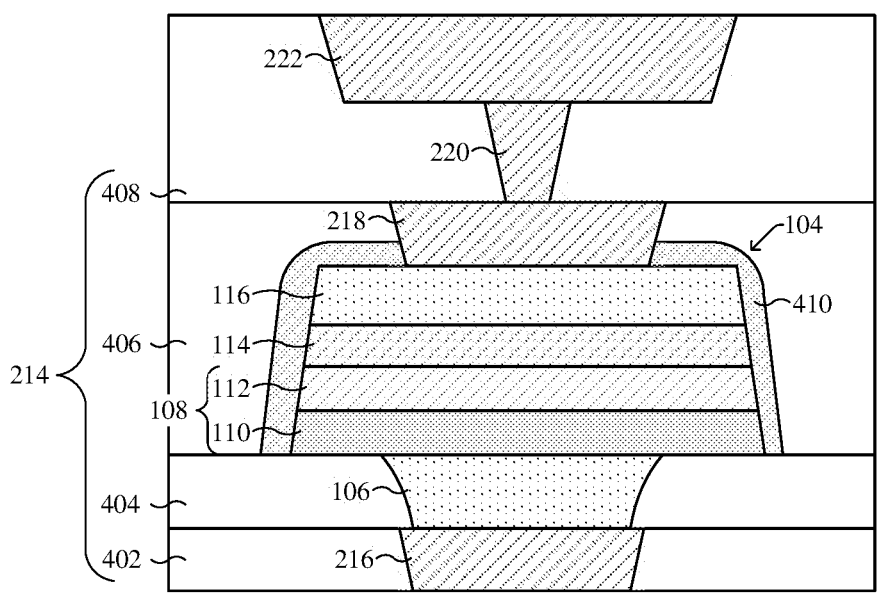
FIGS. 4A-4C and 5A-5B illustrate cross-sectional views of some alternative embodiments of the memory device of FIG. 2.

FIG. 4A illustrates a cross-sectional view of some embodiments of a memory device 400a corresponding to some alternative embodiments of the memory device 200 of FIG. 2.

The interconnect dielectric structure 214 comprises a plurality of dielectric layers. The dielectric layers include a first inter-metal dielectric (IMD) layer 402, an etch stop layer 404, a second IMD layer 406, and a third IMD layer 408. In some embodiments, the etch stop layer 404 may be or comprise silicon nitride, silicon carbide, silicon oxynitride, silicon oxycarbide, another dielectric material, or any combination of the foregoing. In yet further embodiments, the first, second, and third IMD layers 402, 406, 408 may each be or comprise a low κ dielectric material, an extreme low κ dielectric material, or another suitable dielectric material. In some embodiments, the memory cell 104 has slanted opposing outer sidewalls. A sidewall spacer structure 410 is disposed over and around layers of the memory cell 104. In further embodiments, the sidewall spacer structure 410 may be or comprise silicon nitride, silicon carbide, silicon oxynitride, silicon oxycarbide, another suitable material, or any combination of the foregoing.

Figure 4B:
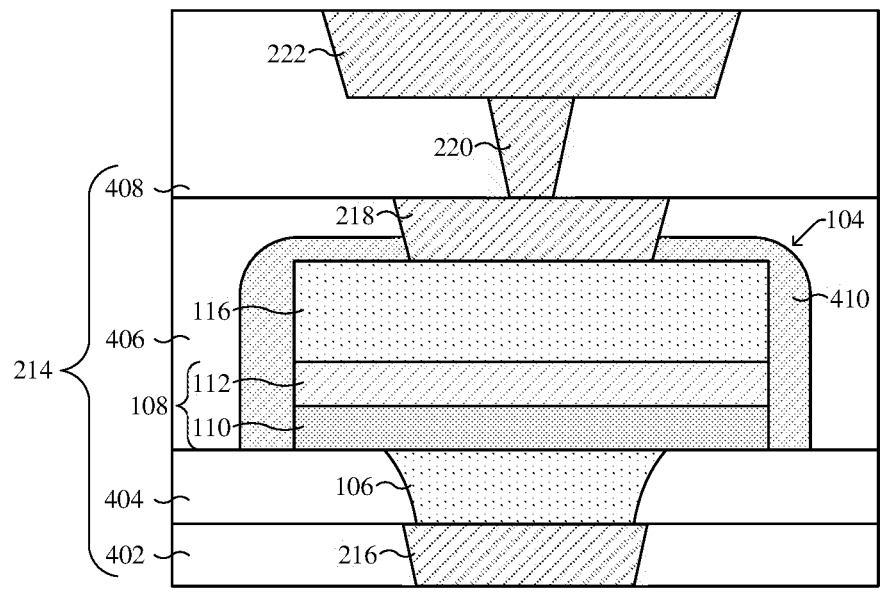

FIG. 4B illustrates a cross-sectional view of some embodiments of a memory device 400b corresponding to some alternative embodiments of the memory device 400a of FIG. 4A, wherein the capping layer (114 of FIG. 4A) is omitted such that the top electrode 116 directly contacts the data storage structure 108. In yet further embodiments, the top electrode 116 comprises one or more top electrode layers, such that the capping layer (114 of FIG. 4A) is a bottommost top electrode layer of the top electrode 116 (not shown). In such embodiments, the top electrode 116 may be or comprise copper, aluminum, tungsten, tantalum, tantalum nitride, titanium, titanium nitride, hafnium, zirconium, gold, silver, tellurium, copper tellurium, aluminum nitride, platinum, nickel, ruthenium, iridium, another conductive material, or any combination of the foregoing.

Figure 4C:
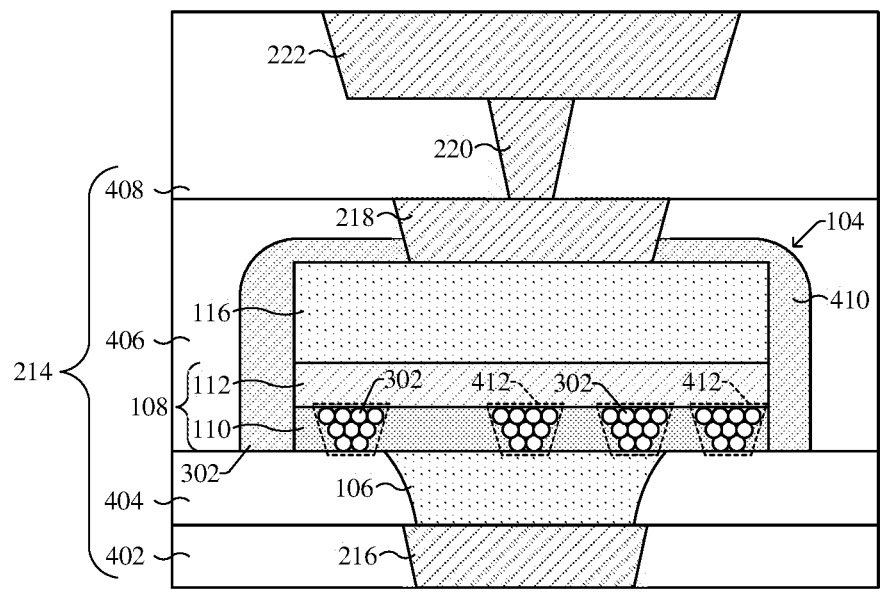

FIG. 4C illustrates a cross-sectional view of some embodiments of a memory device 400c corresponding to some alternative embodiments of the memory device 400b of FIG. 4B, in which the lower switching layer 110 comprises a plurality of intrinsic conductive paths disposed within a plurality of regions 412 distributed across a width of the lower switching layer 110.

Figure 5A:
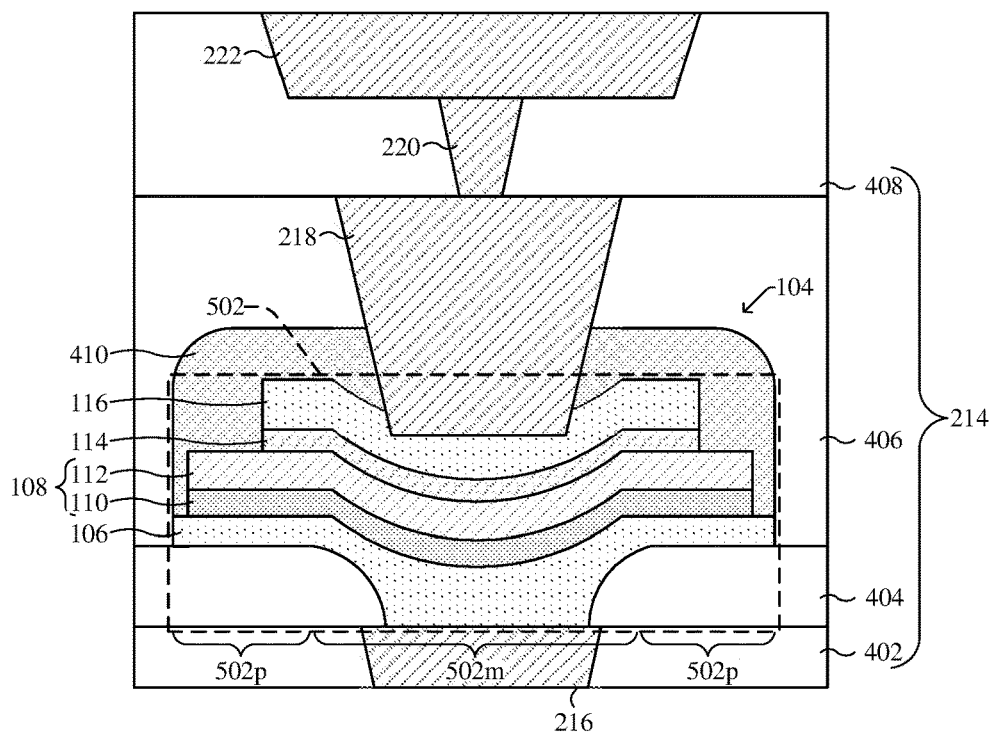

FIG. 5A illustrates a cross-sectional view of some embodiments of a memory device 500a corresponding to some alternative embodiments of the memory device 400a of FIG. 4A.

The memory cell 104 contains a memory layer stack 502 comprising the bottom electrode 106, the lower switching layer 110, the upper switching layer 112, the capping layer 114, and the top electrode 116. The memory layer stack 502 comprises a middle region 502m over the lower conductive wire 216, and a peripheral region 502p that is laterally offset from the lower conductive wire 216. A bottom surface of the middle region 502m of the memory layer stack 502 is below a bottom surface of the peripheral region 502p of the memory layer stack 502.

In some embodiments, the layers within the memory layer stack 502 are respectively non-planar. This is because the layers are disposed within/over a trench defined by sidewalls of the etch stop layer 404. For example, the bottom electrode 106 continuously extends from a top surface of the etch stop layer 404 and along sidewalls of the etch stop layer 404 to a top surface of the lower conductive wire 216. Further, layers within the memory layer stack 502 that overlie the bottom electrode 106 conform to a shape of the bottom electrode 106. Thus, the lower switching layer 110, the upper switching layer 112, the capping layer 114, and the top electrode are respectively non-planar.

Figure 5B:
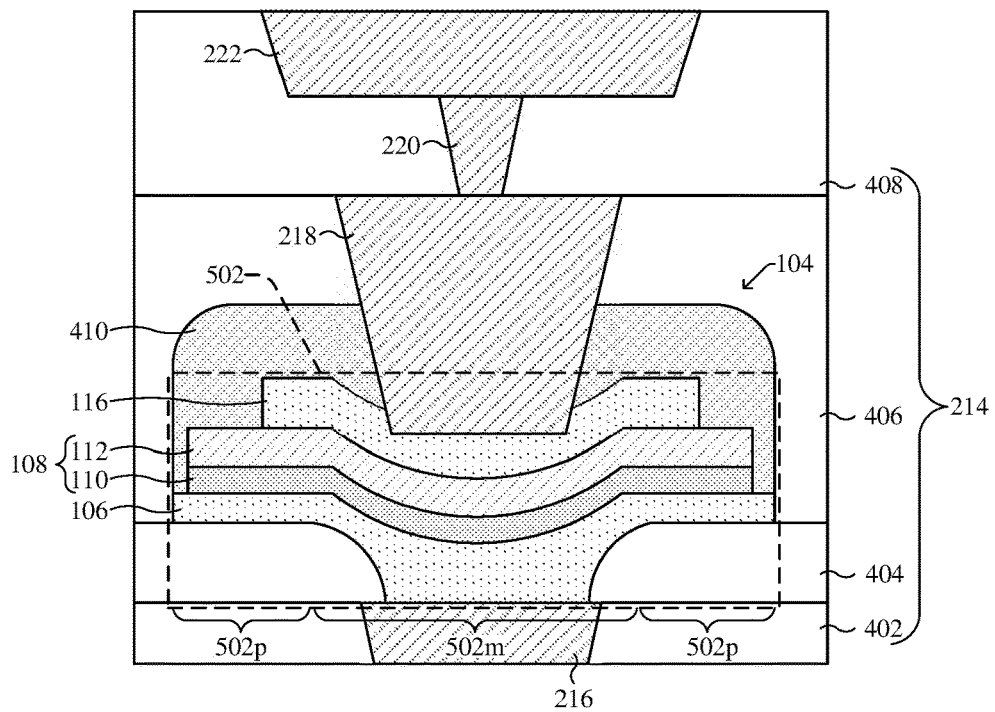

FIG. 5B illustrates a cross-sectional view of some embodiments of a memory device 500b corresponding to some alternative embodiments of the memory device 500a of FIG. 5A, wherein the capping layer (114 of FIG. 5A) is omitted such that the top electrode 116 directly contacts the data storage structure 108. In yet further embodiments, the top electrode 116 comprises one or more top electrode layers, such that the capping layer (114 of FIG. 5A) is a bottommost top electrode layer of the top electrode 116. In such embodiments, the top electrode 116 may be or comprise copper, aluminum, tungsten, tantalum, tantalum nitride, titanium, titanium nitride, hafnium, zirconium, gold, silver, tellurium, copper tellurium, aluminum nitride, platinum, nickel, ruthenium, iridium, another conductive material, or any combination of the foregoing.

Figure 6:
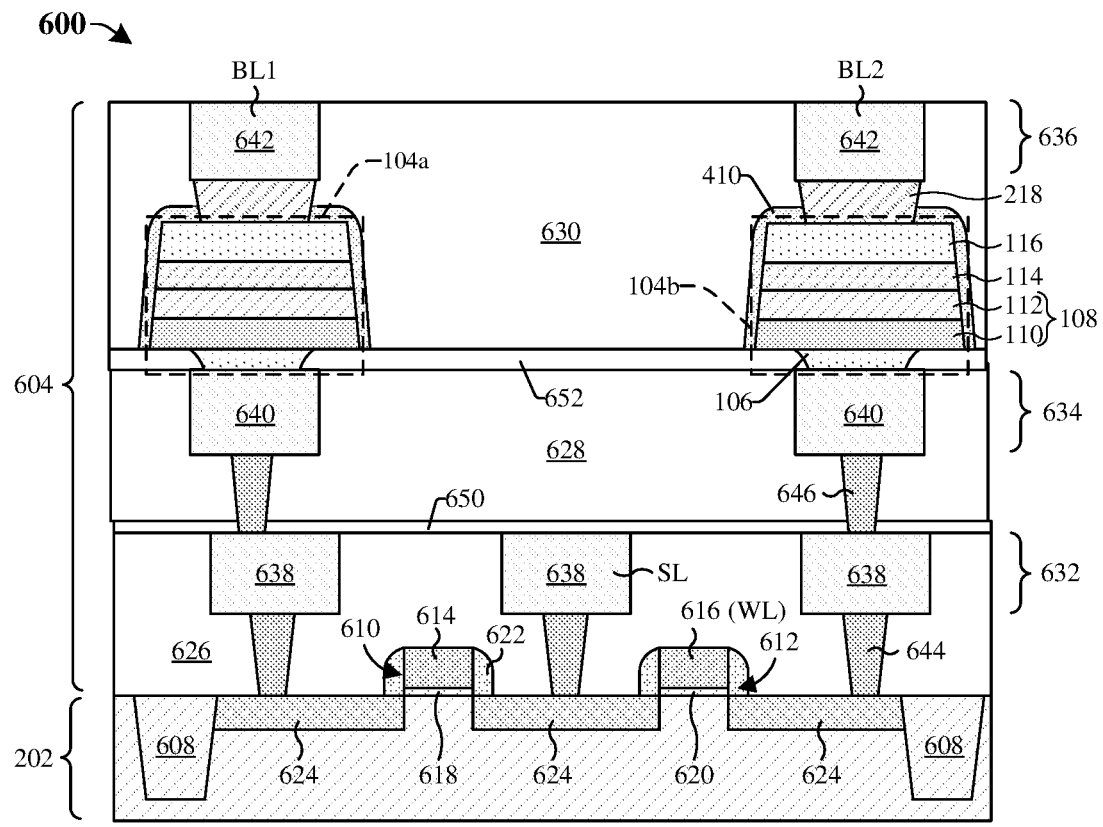
FIG. 6 illustrates a cross-sectional view of some embodiments of an integrated chip including memory cells that each have a low forming voltage disposed within an interconnect structure that overlies a substrate.

FIG. 6 illustrates a cross-sectional view of some embodiments of an integrated chip 600 comprising an interconnect structure 604 overlying a substrate 202.

The integrated chip 600 includes memory cells 104a-b disposed within the interconnect structure 604 between neighboring metal layers of the interconnect structure 604. Further, one or more shallow trench isolation (STI) structures 608 are disposed within the substrate 202 and may include a dielectric material (e.g., silicon dioxide, silicon carbide, silicon nitride, etc.) disposed within a trench of the substrate 202.

Two access transistor 610, 612 are disposed within/over the substrate 202 between the STI structures 608. The access transistors 610, 612 include access gate electrodes 614, 616, respectively; access gate dielectrics 618, 620, respectively; access sidewall spacers 622; and source/drain regions 624. The source/drain regions 624 are disposed within the substrate 202 between the access gate electrodes 614, 616 and the STI structures 608, and are doped to have a first conductivity type which is opposite a second conductivity type of a channel region under the gate dielectrics 618, 620, respectively.

The access gate electrodes 614, 616 may, for example, be doped polysilicon or a metal, such as aluminum, copper, or any combinations thereof. The access gate dielectrics 618, 620 may, for example, be an oxide, such as silicon dioxide, a high κ dielectric material, such as aluminum oxide, hafnium oxide, or any combinations thereof. Further, the access sidewall spacers 622 may, for example, be or comprise silicon nitride (e.g., $Si_3N_4$), silicon carbide, another dielectric material, or any combinations thereof. In some embodiments, the access transistors 610, 612 may, for example, be respectively electrically coupled to a word line (WL) such that an appropriate WL signal (e.g., current and/or voltage) can be applied to the access gate electrode 614, 616.

The interconnect structure is arranged over the substrate 202 and couples devices (e.g., the access transistors 610, 612, and/or the memory cells 104a-b) to one another. The interconnect structure 604 includes a plurality of inter-metal dielectric (IMD) layers 626, 628, 630, and a plurality of metallization layers 632, 634, 636 which are layered over one another in an alternating fashion. The IMD layers 626,

628, 630 may be made of, for example, a low κ dielectric, such as un-doped silicate glass, or an oxide, such as silicon dioxide, or an extreme low κ dielectric layer, or any combinations thereof. The metallization layers 632, 634, 636 include metal lines 638, 640, 642 which are formed within trenches, and which may be made of a metal such as copper, aluminum, ruthenium, or any combinations thereof. Contacts 644 extend from the bottom metallization layer 632 to the source/drain regions 624 and/or the access gate electrodes 614, 616; and vias 646 extend between the metallization layers 632, 634, 636. The vias 646 and/or the bottom electrodes 106 extend through dielectric-protections layers 650, 652 (which can be made of dielectric material and can act as etch stop layers during manufacturing). The dielectric-protections layers 650, 652 may be made of silicon nitride, silicon carbide, another suitable dielectric material, or any combinations thereof. The contacts 644 and the vias 646 may be made of a metal, such as copper, aluminum, tungsten, ruthenium, for example.

The memory cells 104a-b are configured to store respective data states, and are arranged within the interconnect structure 604 between neighboring metal layers. The memory cells 104a-b respectively include the bottom electrode 106, the lower switching layer 110, the upper switching layer 112, the capping layer 114, and/or the top electrode 116. A first memory cell 104a is electrically connected to a first bit line BL1 through a metal line 642, and a second memory cell 104b is electrically connected to a second bit line BL2 through another metal line 642. Thus, an appropriate WL signal (e.g., a voltage and/or a current) can be applied to the access gate electrodes 614, 616 to electrically couple the first memory cell 104a to the first bit line BL1 and a source line (SL), and to electrically couple the second memory cell 104b to the second bit line BL2 and the SL. The SL is electrically coupled to a middle source/drain region 624 that is shared between the access transistors 610, 612. Thus, in some embodiments, an output of the first and/or second bit lines BL1-2 and/or the memory cells 104a-b may be accessed at the SL upon application of the appropriate WL signal. In further embodiments, appropriate bias conditions may be applied to the access transistors 610, 612 and the memory cells 104a-b by way of the WL, SL, BL1, and BL2 such that a forming operation, a set operation, a reset operation, and/or a read operation may be performed on the first and/or second memory cells 104a-b.

FIGS. 7-14 illustrate cross-sectional views 700-1400 of some embodiments of a first method of forming a memory device including a memory cell with a data storage structure having a lower switching layer doped with one or more dopants according to the present disclosure. Although the cross-sectional views 700-1400 shown in FIGS. 7-14 are described with reference to a first method, it will be appreciated that the structures shown in FIGS. 7-14 are not limited to the first method but rather may stand alone separate of the method. Although FIGS. 7-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7:
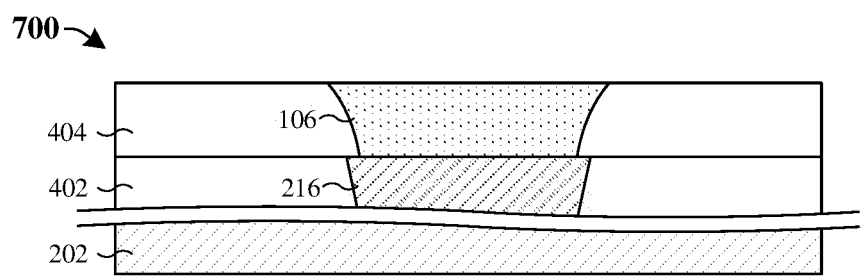
FIGS. 7-14 illustrate cross-sectional views of some embodiments of a first method of forming a memory cell with a data storage structure having a lower switching layer doped with one or more dopants.

As shown in cross-sectional view 700 of FIG. 7, a first inter-metal dielectric (IMD) layer 402 is formed over a substrate 202, and a lower conductive wire 216 is formed within the first IMD layer 402. In some embodiments, the substrate 202 may, for example, be or comprise a semiconductor body such as monocrystalline silicon/CMOS bulk, silicon-germanium (SiGe), a silicon-on-insulator (SOI) or another suitable substrate material and/or the substrate 202 may comprise a first doping type (e.g., p-type). The first IMD layer 402 may, for example, be or comprise silicon dioxide, a low κ dielectric material, an extreme low κ dielectric material, another suitable dielectric material, or a combination of the foregoing. Further, the lower conductive wire 216 may, for example, be or comprise copper, aluminum, tungsten, another conductive material, or any combination of the foregoing.

Further, as illustrated in FIG. 7, an etch stop layer 404 is formed over the first IMD layer 402, and a bottom electrode 106 is formed within the etch stop layer 404 directly over the lower conductive wire 216. In some embodiments, the etch stop layer 404 may be deposited by chemical vapor deposition (CVD), physical vapor deposition (PVD), atomic layer deposition (ALD), or another suitable deposition or growth process. Subsequently, the bottom electrode 106 is formed within the etch stop layer 404. In some embodiments, a process for forming the bottom electrode 106 includes: forming a masking layer (not shown) over the etch stop layer 404; patterning the etch stop layer 404 according to the masking layer, thereby forming a bottom electrode opening with the etch stop layer 404 and over the lower conductive wire 216; depositing (e.g., via PVD, CVD, electroless plating, electro plating, sputtering, etc.) a bottom electrode material over the etch stop layer 404, thereby filling the bottom electrode opening; and performing a planarization process (e.g., a chemical mechanical polishing (CMP) process) on the bottom electrode material, thereby forming the bottom electrode 106. In further embodiments, a top surface of the bottom electrode 106 is co-planar with a top surface of the etch stop layer 404. The etch stop layer 404 may, for example, be or comprise silicon nitride, silicon carbide, silicon oxycarbide, silicon oxynitride, another dielectric material, or any combination of the foregoing. Further, the bottom electrode 106 may, for example, be or comprise titanium, tantalum, titanium nitride, tantalum nitride, platinum, nickel, hafnium, zirconium, ruthenium, iridium, another conductive material, or any combination of the foregoing.

Figure 8A:
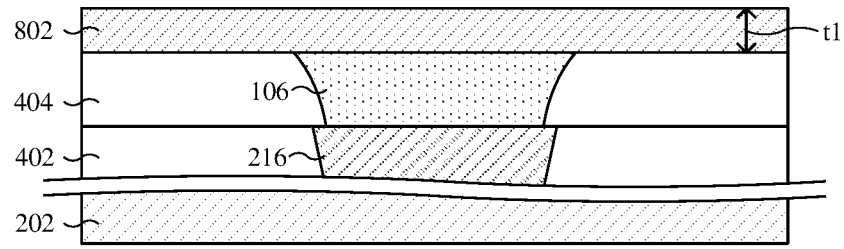
Figure 8B:
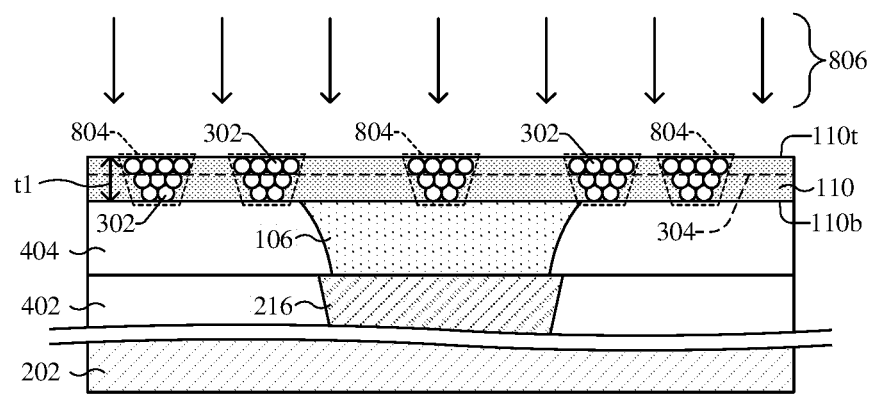
Figure 9:
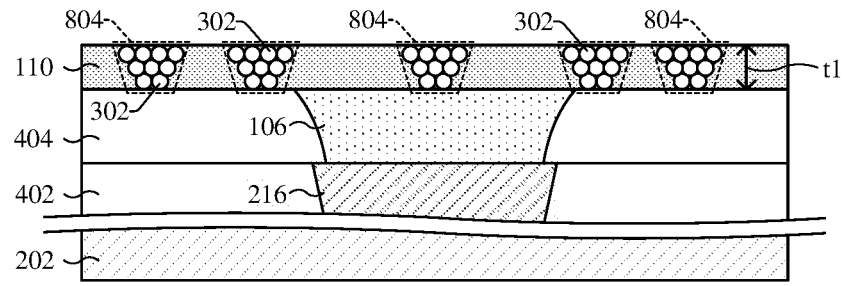

FIGS. 8A and 8B illustrate cross-sectional views 800a and 800b of a first embodiment of the first method. Further, FIG. 9 illustrates a cross-sectional view 900 corresponding to an alternative, second embodiment of the first method. For example, in the first embodiment of the first method, the first method may flow from FIG. 7 to FIGS. 8A-8B, then from FIG. 8B to FIGS. 10-14 (i.e., skipping FIG. 9). In yet another embodiment, in the second embodiment of the second method, the first method may flow from FIG. 7 to FIG. 9, then from FIG. 9 to FIGS. 10-14 (i.e., skipping FIGS. 8A-8B).

As shown in cross-sectional view 800a of FIG. 8A, an undoped lower switching film 802 is formed over the bottom electrode 106 and the etch stop layer 404. In some embodiments, the undoped lower switching film 802 may be deposited by a CVD process, an ALD process, a PVD process, or another suitable deposition or growth process and/or may be formed to a thickness t1 that is within a range of about 1.5 to 2 nanometers (nm), within a range of about 1.5 to 1.75 nm, within a range of about 1.75 to 2 nm, or another suitable thickness value. In yet further embodiments, the undoped lower switching film 802 may, for example, be or comprise a data storage dielectric material such as hafnium oxide ($HfO_2$), zirconium oxide ($ZrO_2$), aluminum oxide ($Al_2O_3$), tantalum oxide ($Ta_2O_5$), hafnium aluminum oxide (HfAlO), hafnium zirconium oxide (HfZrO), silicon dioxide ($SiO_2$), another dielectric material, or any combination of the foregoing. In some embodiments, the undoped lower switching film 802 may be formed as a stack of dielectric layers that each may be or comprise the data storage dielectric material (e.g., $HfO_2$, $ZrO_2$, $Al_2O_3$, $Ta_2O_5$, HfAlO, HfZrO, $SiO_2$, another dielectric material, or any combination of the foregoing).

As shown in cross-sectional view 800b of FIG. 8B, a doping process is performed on the undoped lower switching film (802 of FIG. 8A), thereby forming a lower switching layer 110 over the bottom electrode 106. In some embodiments, the doping process includes: implanting one or more dopants 806 into the undoped lower switching film (802 of FIG. 8A); and performing a thermal annealing process on the undoped lower switching film (802 of FIG. 8A), thereby forming the lower switching layer 110. In some embodiments, the one or more dopants 806 includes the first dopant (e.g., hydrogen (e.g., $H^+$)), the second dopant (e.g., nitrogen ($N_2$)), a doping compound (e.g., ammonia (e.g., $NH_3$), or the like) comprising the first and second dopants, another suitable dopant, or any combination of the foregoing.

Thus, in some embodiments, the lower switching layer 110 is formed in such a manner that the lower switching layer 110 comprises the data storage dielectric material (e.g., $HfO_2$, $ZrO_2$, $Al_2O_3$, $Ta_2O_5$, HfAlO, HfZrO, $SiO_2$, another dielectric material, or any combination of the foregoing) doped with a first dopant (e.g., hydrogen), or co-doped with the first dopant and a second dopant (e.g., nitrogen). Further, the lower switching layer 110 may, for example, be formed such that the lower switching layer 110 comprises a first atomic percentage of the first dopant and/or a second atomic percentage of the second dopant. In some embodiments, the first atomic percentage may be within a range of about 3 to 10 percent, within a range of about 1.5 to 30 percent, or another suitable value. In further embodiments, the second atomic percentage may be within a range of about 3 to 20 percent. In an embodiment, the lower switching layer 110 is devoid of the second dopant, such that the second atomic percentage is 0. In another embodiment, in which the lower switching layer 110 is co-doped with the first and second dopants, then the first atomic percentage is less than second atomic percentage.

The first dopant (e.g., hydrogen) is configured to react with oxygen atoms within the lower switching layer 110, thereby forming a compound (e.g., hydroxide ($OH^-$)) of the first dopant and oxygen within the lower switching layer 110. In further embodiments, the first dopant breaks bonds between the metal atoms and oxygen atoms within the lower switching layer 110, thereby forming a plurality of intrinsic oxygen vacancies 302 within the lower switching layer 110. The intrinsic oxygen vacancies 302 tend to align to form one or more intrinsic conductive paths (i.e., intrinsic conductive filaments) within one or more regions 804 of the lower switching layer 110. In further embodiments, the doping process is performed such that a concentration of the first dopant and/or second dopant may continuously increase from a top surface 110t of the lower switching layer 110 to a horizontal line 304, and the concentration of the first dopant and/or second dopant may continuously decrease from the horizontal line 304 to a bottom surface 110b of the lower switching layer 110 (as illustrated and/or described in FIG. 3A).

Alternatively, as shown in cross-sectional view 900 of FIG. 9, a lower switching layer 110 is formed over the bottom electrode 106 and the etch stop layer 404. In some embodiments, the lower switching layer 110 may, for example, be formed by CVD, PVD, ALD, co-sputtering, or another suitable deposition or growth process that in-situ dopes the lower switching layer 110 with the first dopant (e.g., hydrogen), or co-dopes the lower switching layer 110 with the first dopant and the second dopant (e.g., nitrogen). Thus, the lower switching layer 110 is formed in such a manner that the lower switching layer 110 comprises a data storage dielectric material (e.g., $HfO_2$, $ZrO_2$, $Al_2O_3$, $Ta_2O_5$, HfAlO, HfZrO, $SiO_2$, another dielectric material, or any combination of the foregoing) in-situ doped with the first dopant (e.g., hydrogen), or in-situ co-doped with the first dopant and the second dopant (e.g., nitrogen).

In an embodiment, a process for forming the lower switching layer 110 may include depositing a data storage dielectric material (e.g., $HfO_2$, $ZrO_2$, $Al_2O_3$, $Ta_2O_5$, HfAlO, HfZrO, $SiO_2$, etc.) by a deposition process (e.g., CVD, PVD, ALD, co-sputtering, etc.), while concurrently exposing the data storage dielectric material to the first dopant (e.g., hydrogen) and/or the second dopant (e.g., nitrogen). In yet further embodiments, the lower switching layer 110 may be formed in a processing chamber where the processing chamber is heated to a temperature of about 250 to 300 degrees Celsius, or the like. In yet further embodiments, the lower switching layer 110 is formed to a thickness t1 within a range of about 1.5 to 2 nm.

Another process for forming the lower switching layer 110 may include performing a deposition process (e.g., ALD, CVD, PVD, sputtering, etc.) to deposit the data storage dielectric material in a plasma environment, where the plasma comprises, for example, nitrogen (e.g., $N_2$), hydrogen (e.g., $H_2$), ammonium hydroxide (e.g., $NH_4OH$ or $H_5NO$), ammonia (e.g., $NH_3$), any combination of the foregoing, or the like. In some embodiments, forming the lower switching layer 110 includes introducing a first precursor and a second precursor into a processing chamber that comprises the substrate 202. The first precursor may, for example, be or comprise hafnium tetrachloride (e.g., $HfCl_4$), tantalum (V) chloride ($TaCl_5$), or another precursor. The second precursor may, for example, be or comprise ammonium hydroxide (e.g., $NH_4OH$ or $H_5NO$), another suitable precursor (e.g., comprising the first dopant and/or second dopant), or any combination of the foregoing. Thus, in some embodiments, the lower switching layer 110 may be deposited while in-situ co-doping the lower switching layer 110 with the first and second dopants. In addition, as described above in FIG. 8B, by forming the lower switching layer 110 with the first dopant (e.g., hydrogen) one or more intrinsic conductive paths, comprising intrinsic oxygen vacancies 302, are formed within one or more regions 804 of the lower switching layer 110.

In yet further embodiments, the lower switching layer 110 may, for example, be formed such that the lower switching layer 110 comprises a first atomic percentage of the first dopant and/or a second atomic percentage of the second dopant. In some embodiments, the first atomic percentage may be within a range of about 3 to 10 percent, within a range of about 1.5 to 30 percent, or another suitable value. In further embodiments, the second atomic percentage may be within a range of about 3 to 20 percent. In an embodiment, the lower switching layer 110 is devoid of the second dopant, such that the second atomic percentage is 0. In another embodiment, in which the lower switching layer 110 is co-doped with the first and second dopants, then the first atomic percentage is less than the second atomic percentage.

Figure 10:
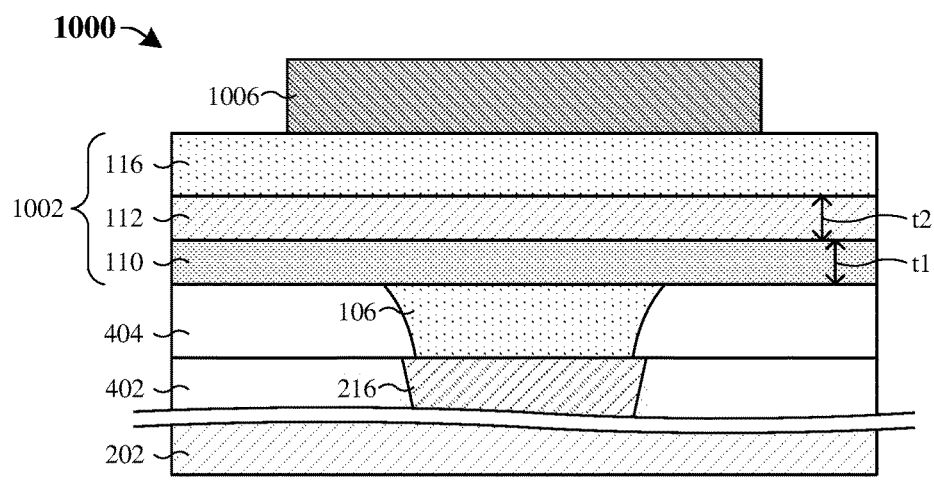

As shown in cross-sectional view 1000 of FIG. 10, an upper switching layer 112 is formed over the lower switching layer 110, and a top electrode 116 is formed over the upper switching layer 112, thereby defining a stack of memory layers 1002 over the bottom electrode 106. The stack of memory layers 1002 includes the lower switching layer 110, the upper switching layer 112, and the top electrode 116. In some embodiments, the upper switching layer 112 may be deposited by CVD, PVD, ALD, or another suitable deposition or growth process and/or may be formed to a thickness t2 that is within a range of about 2 to 3 nm. In further embodiments, the thickness t2 of the upper switching layer 112 is greater than the thickness t1 of the lower switching layer 110. Further, the upper switching layer 112 may, for example, be or comprise hafnium oxide ($HfO_2$), zirconium oxide ($ZrO_2$), aluminum oxide ($Al_2O_3$), tantalum oxide ($Ta_2O_5$), hafnium aluminum oxide (HfAlO), hafnium zirconium oxide (HfZrO), silicon dioxide ($SiO_2$), another dielectric material, or any combination of the foregoing. Thus, in some embodiments, the upper switching layer 112 and the lower switching layer 110 both comprise the data storage dielectric material. Further, a masking layer 1006 is formed over the top electrode 116, such that the masking layer 1006 covers a center region of the stack of memory layers 1002, while leaving a peripheral region of the stack of memory layers 1002 uncovered and/or exposed.

Further, the top electrode 116 may, for example, be deposited by CVD, PVD, sputtering, electro plating, electroless plating, or another suitable deposition or growth process. In some embodiments, the top electrode 116 may be or comprise titanium, tantalum, titanium nitride, tantalum nitride, platinum, nickel, hafnium, zirconium, ruthenium, iridium, another conductive material, or any combination of the foregoing. In further embodiments, forming the upper switching layer 112 includes introducing a first precursor and a third precursor into a processing chamber that comprises the substrate 202. The first precursor may, for example, be or comprise hafnium tetrachloride (e.g., $HfCl_4$), tantalum (V) chloride ($TaCl_5$), or another precursor. The third precursor may, for example, be or comprise water ($H_2O$), another suitable precursor, or any combination of the foregoing. In yet further embodiments, a capping layer (not shown) is formed between the top electrode 116 and the upper switching layer 112, where the capping layer is substantially similar to the capping layer 114 of FIGS. 1-3B. In an alternative embodiment, the top electrode 116 comprises a plurality of top electrode layers, such that a bottommost top electrode layer is configured as the capping layer (e.g., as described in FIG. 4B or 5B).

Figure 11:
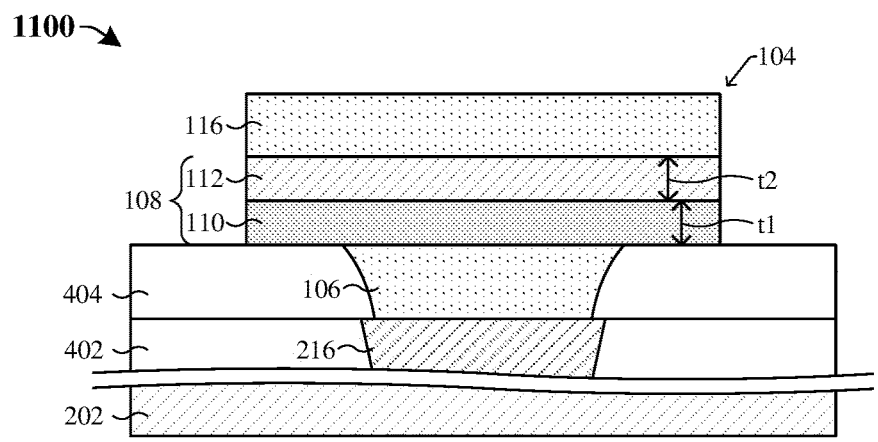

As shown in cross-sectional view 1100 of FIG. 11, a patterning process is performed on the stack of memory layers (1002 of FIG. 10) according to the masking layer (1006 of FIG. 10), thereby forming a data storage structure 108 and a memory cell 104. The patterning process may, for example, include performing one or more of a wet etch process, a dry etch process, another suitable etch process, or any combination of the foregoing. In various embodiments, the memory cell 104 includes the bottom electrode 106, the lower switching layer 110, the upper switching layer 112, and the top electrode 116. In an embodiment, a process for forming the lower switching layer 110 includes the deposition process of FIG. 8A, the doping process of FIG. 8B, and the patterning process of FIG. 11. In another embodiments, a process for forming the lower switching layer 110 includes the forming process of FIG. 9, and the patterning process of FIG. 11. Further, the data storage structure 108 includes the lower switching layer 110 and the upper switching layer 112.

Figure 12:
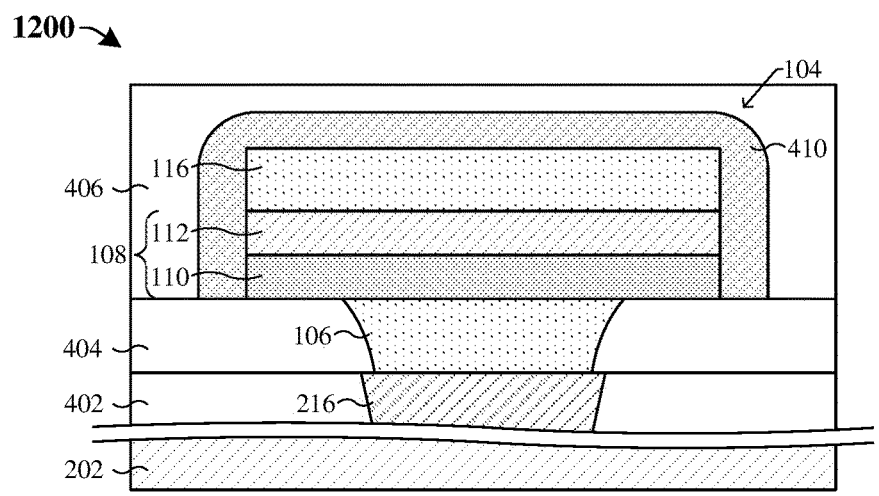

As shown in cross-sectional view 1200 of FIG. 12, a sidewall spacer structure 410 is formed over the memory cell 104, and a second IMD layer 406 is formed over the sidewall spacer structure 410 and the etch stop layer 404. In some embodiments, the sidewall spacer structure 410 and/or the second IMD layer 406 are respectively deposited by, for example, CVD, PVD, ALD, or another suitable formation or growth process. In some embodiments, the sidewall spacer structure 410 may be or comprise silicon nitride, silicon carbide, silicon oxynitride, silicon oxycarbide, another suitable dielectric material, or any combination of the foregoing. In further embodiments, a second IMD layer 406 may be or comprise silicon dioxide, a low κ dielectric material, an extreme low κ dielectric material, another suitable dielectric material, or a combination of the foregoing.

Figure 13:
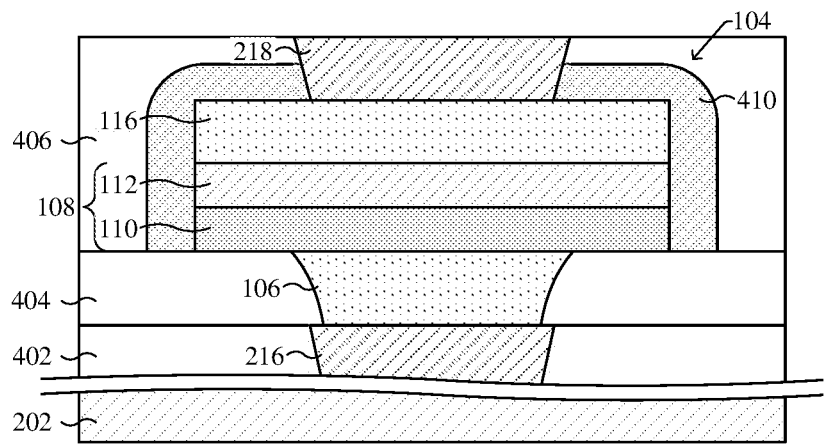

As shown in cross-sectional view 1300 of FIG. 13, an upper conductive wire 218 is formed over the top electrode 116. In some embodiments, a process for forming the upper conductive wire 218 may include: depositing a masking layer (not shown) over the second IMD layer 406; patterning the second IMD layer 406 and the sidewalls spacer structure 410 according to the masking layer, thereby forming an upper conductive wire opening over the top electrode 116; depositing (e.g., by CVD, PVD, sputtering, electro plating, electroless plating, or another suitable formation or growth process) a conductive material (e.g., comprising copper, aluminum, tungsten, another conductive material, or any combination of the foregoing) over the second IMD layer 406 and the top electrode 116; and performing a planarization process (e.g., a CMP process) into the conductive material, thereby forming the upper conductive wire 218.

Figure 14:
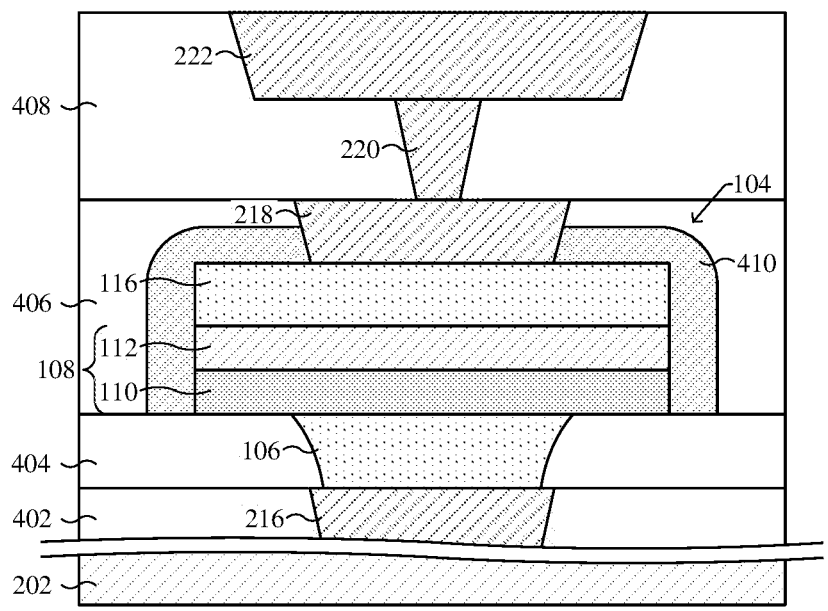

As shown in cross-sectional view 1400 of FIG. 14, a third IMD layer 408 is formed over the second IMD layer 406, and an upper conductive via 220 and a second upper conductive wire 222 are formed within the third IMD layer 408. In some embodiments, the third IMD layer 408 is deposited by, for example, CVD, PVD, ALD, or another suitable formation or growth process. In further embodiments, the upper conductive via 220 and the second upper conductive wire 222 may be formed by a single damascene process, a dual damascene process, or another suitable formation process. In some embodiments, the third IMD layer 408 may, for example, be or comprise silicon dioxide, a low κ dielectric material, an extreme low κ dielectric material, another suitable dielectric material, or a combination of the foregoing. In further embodiments, the upper conductive via 220 and the second upper conductive wire 222 may, for example, respectively be or comprise copper, aluminum, titanium nitride, tantalum nitride, tungsten, ruthenium, another conductive material, or any combination of the foregoing.

FIGS. 15-24 illustrate cross-sectional views 1500-2400 of some embodiments of a second method of forming a memory device including a memory cell with a data storage structure having a lower switching layer doped with one or more dopants according to the present disclosure. Although the cross-sectional views 1500-2400 shown in FIGS. 15-24 are described with reference to a second method, it will be appreciated that the structures shown in FIGS. 15-24 are not limited to the second method but rather may stand alone separate of the method. Although FIGS. 15-24 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 15:
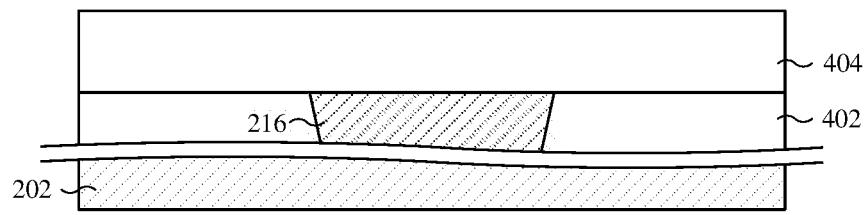
FIGS. 15-24 illustrate cross-sectional views of some embodiments of a second method of forming a memory cell with a data storage structure having a lower switching layer doped with one or more dopants.

As shown in cross-sectional view 1500 of FIG. 15, a first inter-metal dielectric (IMD) layer 402 is formed over a substrate 202, and a lower conductive wire 216 is formed within the first IMD layer 402. In some embodiments, the first IMD layer 402 and the lower conductive wire 216 are formed as illustrated and/or described in FIG. 7. Subsequently, an etch stop layer 404 is formed over the lower conductive wire 216. In some embodiments, the etch stop layer 404 may be deposited by CVD, PVD, ALD, or another suitable growth or deposition process. The etch stop layer 404 may, for example, be or comprise silicon nitride, silicon carbide, another dielectric material, or any combination of the foregoing.

Figure 16:
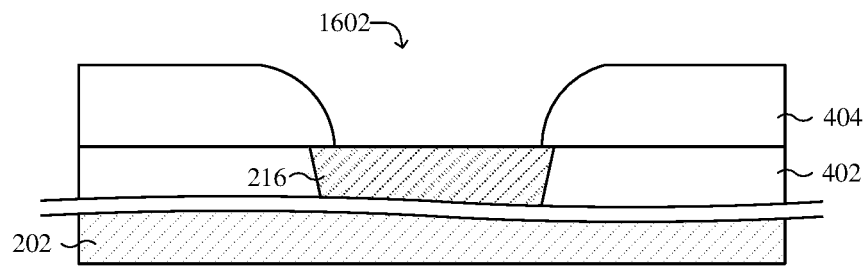

As shown in cross-sectional view 1600 of FIG. 16, a patterning process is performed on the etch stop layer 404, thereby forming a bottom electrode opening 1602 within the etch stop layer 404 and exposing an upper surface of the lower conductive wire 216. In some embodiments, the patterning process includes forming a masking layer (not shown) over the etch stop layer 404, and exposing unmasked regions of the etch stop layer 404 to one or more etchants. In further embodiments, the patterning process includes performing a wet etch process, a dry etch process, another suitable etch process, or any combination of the foregoing.

Figure 17:
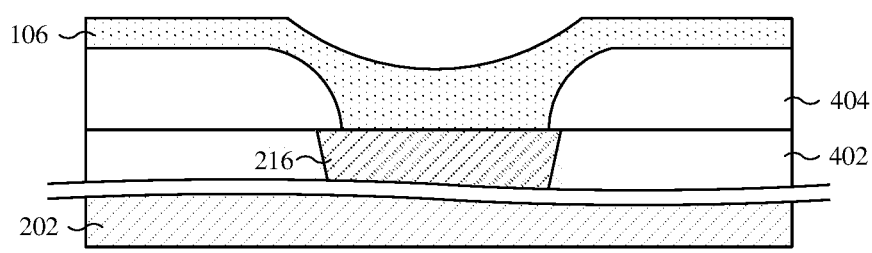

As shown in cross-sectional view 1700 of FIG. 17, a bottom electrode 106 is deposited over the lower conductive wire 216 and the etch stop layer 404, thereby filling the bottom electrode opening 1602. In some embodiments, the bottom electrode 106 may be or comprise titanium, tantalum, titanium nitride, tantalum nitride, platinum, nickel, hafnium, zirconium, ruthenium, iridium, another conductive material, or any combination of the foregoing. In yet further embodiments, the bottom electrode 106 is deposited (e.g., by CVD, PVD, ALD, or another suitable formation or growth process) as a conformal layer that conforms to a shape of opposing sidewalls and/or an upper surface of the etch stop layer 404 that define the bottom electrode opening 1602.

Figure 18A:
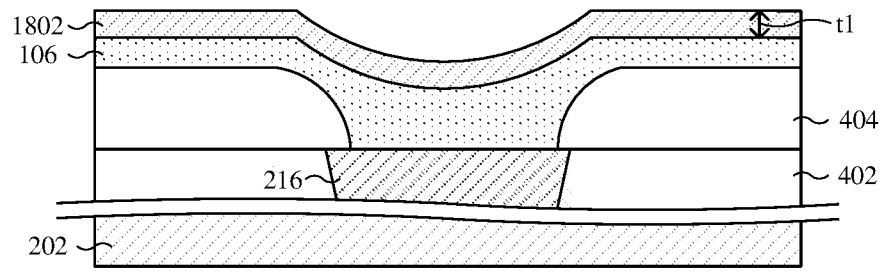
Figure 18B:
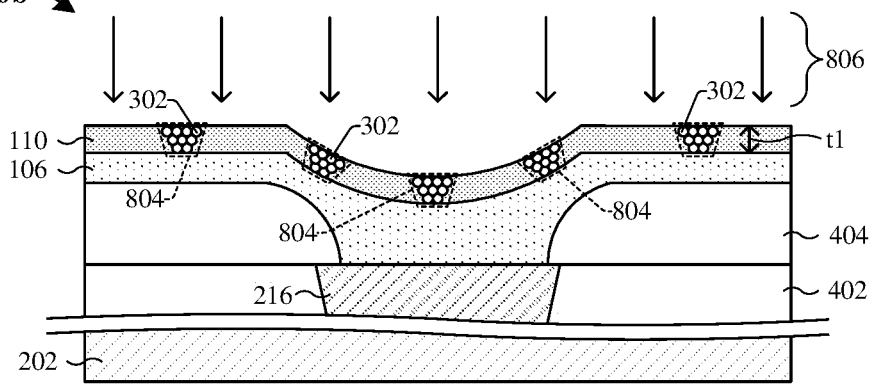
Figure 19:
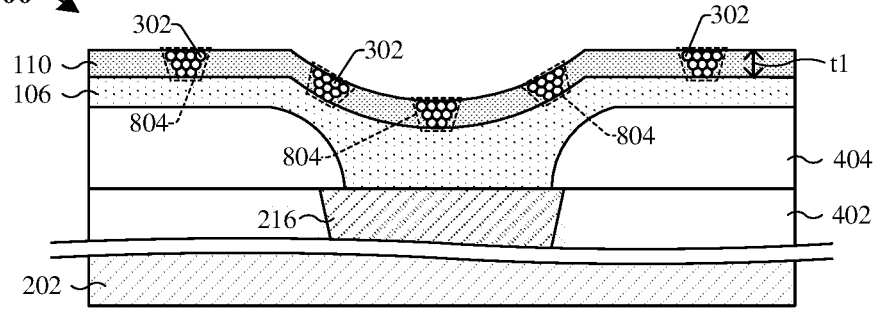

FIGS. 18A and 18B illustrate cross-sectional views 1800a and 1800b of a first embodiment of the second method. Further, FIG. 19 illustrates a cross-sectional view 1900 corresponding to an alternative, second embodiment of the second method. For example, in the first embodiment of the second method, the second method may flow from FIGS. 15-17 to FIGS. 18A-18B, and then from FIG. 18B to FIGS. 20-24 (i.e., skipping FIG. 19). In yet another embodiment, in the second embodiment of the second method, the second method may flow from FIGS. 15-17 to FIG. 19, and then from FIG. 19 to FIGS. 20-24 (i.e., skipping FIGS. 18A-18B).

As shown in cross-sectional view 1800a of FIG. 18A, an undoped lower switching film 1802 is deposited over the bottom electrode 106 and the etch stop layer 404. In such embodiments, the undoped lower switching film 1802 is deposited as a conformal layer that conforms to a shape of the bottom electrode 106. In some embodiments, the undoped lower switching film 1802 is substantially similar to the undoped lower switching film 802 of FIG. 8A. In such embodiments, the undoped lower switching film 1802 is formed by process(es) similar to process(es) illustrated and/or described above regarding formation of the undoped lower switching film 802 of FIG. 8A.

As shown in cross-sectional view 1800b of FIG. 18B, a doping process is performed on the undoped lower switching film (1802 of FIG. 18A), thereby forming a lower switching layer 110 over the bottom electrode 106. In some embodiments, the doping process is performed as illustrated and/or described in FIG. 8B. Thus, the lower switching layer 110 comprises a plurality of intrinsic oxygen vacancies 302 that form a plurality of intrinsic conductive paths within one or more regions 804 of the lower switching layer 110 (e.g., as illustrated and/or described in FIG. 8B).

Alternatively, as shown in cross-sectional view 1900 of FIG. 19, a lower switching layer 110 is formed over the bottom electrode 106. In such embodiments, the lower switching layer 110 is formed as a conformal layer that conforms to a shape of the bottom electrode 106. In some embodiments, the lower switching layer 110 is formed as illustrated and/or described in FIG. 9. Thus, the lower switching layer 110 comprises a plurality of intrinsic oxygen vacancies 302 that form a plurality of intrinsic conductive paths within one or more regions 804 of the lower switching layer 110 (e.g., as illustrated and/or described in FIG. 9).

Figure 20:
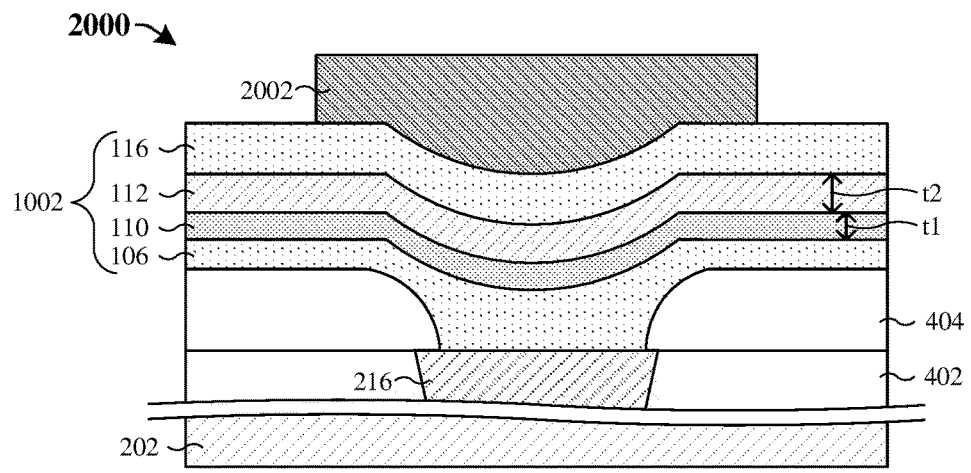

As illustrated in cross-sectional view 2000 of FIG. 20, an upper switching layer 112 is formed over the lower switching layer 110, and a top electrode 116 is formed over the upper switching layer 112, thereby defining a stack of memory layers 1002 over the bottom electrode 106. The stack of memory layers 1002 includes the lower switching layer 110, the upper switching layer 112, and the top electrode 116. In some embodiments, the upper switching layer 112 and the top electrode 116 are formed as illustrated and/or described in FIG. 10. Further, a masking layer 2002 is formed over the top electrode 116.

Figure 21:
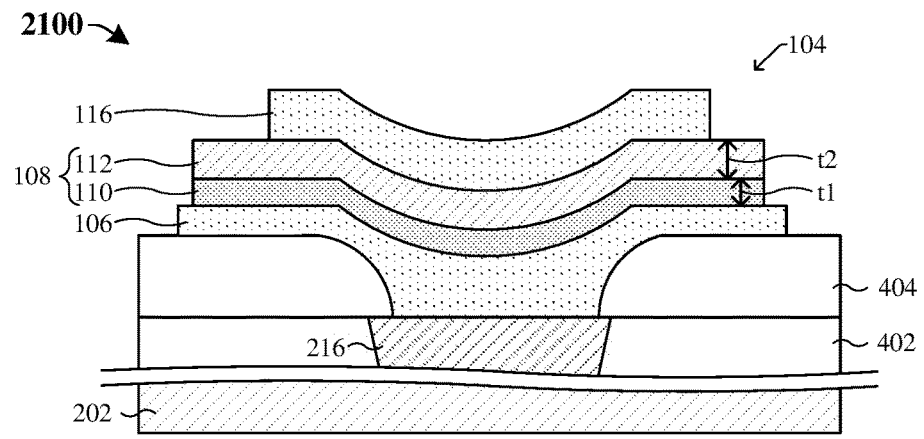

As illustrated in cross-sectional view 2100 of FIG. 21, patterning processes are performed on the stack of memory layers (1002 of FIG. 20) and the bottom electrode 106, thereby forming a memory cell 104 and a data storage structure 108 over the lower conductive wire 216. The memory cell 104 includes the bottom electrode 106, the lower switching layer 110, the upper switching layer 112, and the top electrode 116. In some embodiments, the stack of memory layers (1002 of FIG. 20) and the bottom electrode 106 are patterned according to the masking layer (2002 of FIG. 20). In further embodiments, the patterning process includes performing one or more of a wet etch process, a dry etch process, another suitable etch process, or any combination of the foregoing. In an embodiment, a process for forming the lower switching layer 110 includes the deposition process of FIG. 18A, the doping process of FIG. 18B, and the patterning process of FIG. 21. In an alternative embodiment, a process for forming the lower switching layer 110 includes the forming process of FIG. 19, and the patterning process of FIG. 21. In an embodiment, sidewalls of the bottom electrode 106, the lower switching layer 110, the upper switching layer 112 may be flush, while the top electrode 116 exposes partial top surface of the upper switching layer 112.

Figure 22:
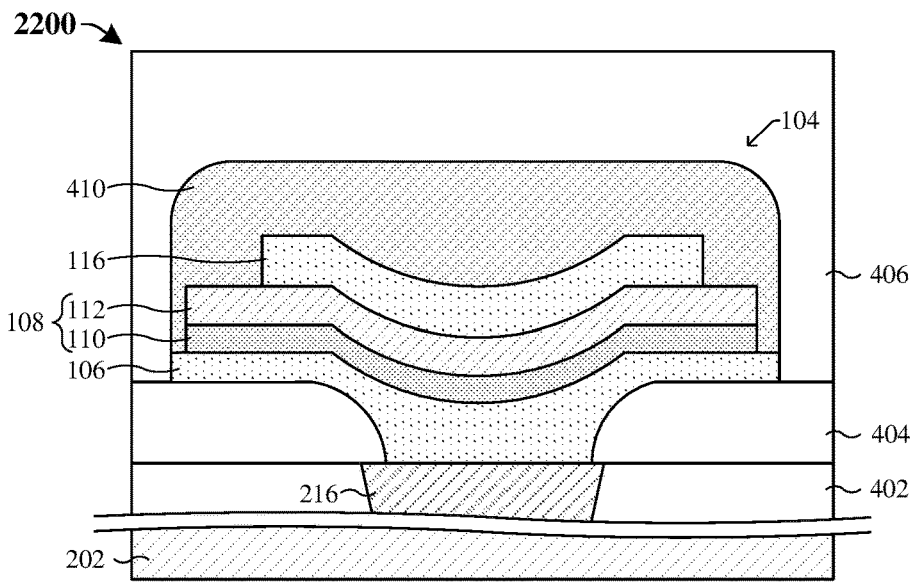

As illustrated in cross-sectional view 2200 of FIG. 22, a sidewall spacer structure 410 is formed over the memory cell 104, and a second IMD layer 406 is formed over the sidewall spacer structure 410 and the etch stop layer 404. In some embodiments, the sidewall spacer structure 410 and/or the second IMD layer 406 are respectively deposited by, for example, CVD, PVD, ALD, or another suitable formation or growth process. In some embodiments, the sidewall spacer structure 410 may be or comprise silicon nitride, silicon carbide, silicon oxynitride, silicon oxycarbide, another suitable dielectric material, or any combination of the foregoing. In further embodiments, a second IMD layer 406 may be or comprise silicon dioxide, a low κ dielectric material, an extreme low κ dielectric material, another suitable dielectric material, or a combination of the foregoing.

Figure 23:
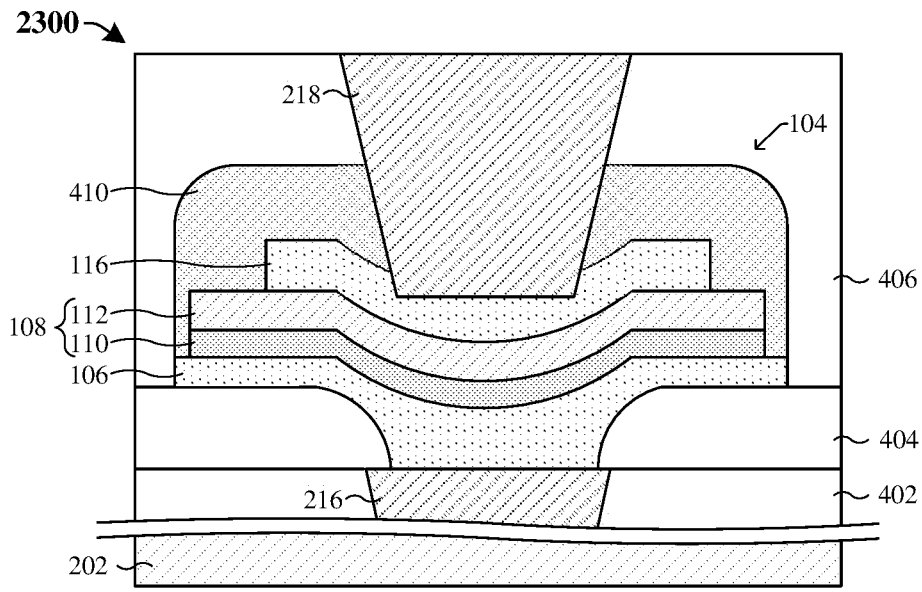

As shown in cross-sectional view 2300 of FIG. 23, an upper conductive wire 218 is formed over the top electrode 116. In some embodiments, a process for forming the upper conductive wire 218 may include: depositing a masking layer (not shown) over the second IMD layer 406; patterning the second IMD layer 406, the sidewalls spacer structure 410, and/or the top electrode 116 according to the masking layer, thereby forming an upper conductive wire opening over the top electrode 116; depositing (e.g., by CVD, PVD, sputtering, electro plating, electroless plating, or another suitable formation or growth process) a conductive material (e.g., comprising copper, aluminum, tungsten, another conductive material, or any combination of the foregoing) over the second IMD layer 406 and the top electrode 116; and performing a planarization process (e.g., a CMP process) into the conductive material, thereby forming the upper conductive wire 218.

Figure 24:
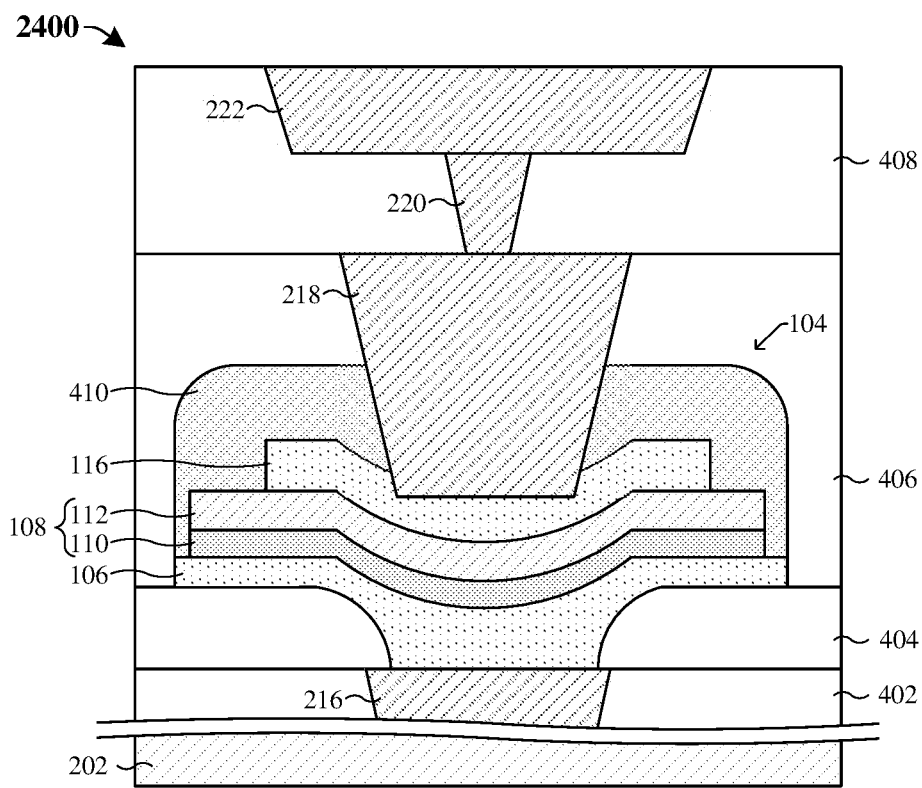

As shown in cross-sectional view 2400 of FIG. 24, a third IMD layer 408 is formed over the second IMD layer 406, and an upper conductive via 220 and a second upper conductive wire 222 are formed within the third IMD layer 408 and over the upper conductive wire 218. In some embodiments, the third IMD layer 408 is deposited by, for example, CVD, PVD, ALD, or another suitable formation or growth process. In further embodiments, the upper conductive via 220 and the second upper conductive wire 222 may be formed by a single damascene process, a dual damascene process, or another suitable formation process. In some embodiments, the third IMD layer 408 may, for example, be or comprise silicon dioxide, a low κ dielectric material, an extreme low κ dielectric material, another suitable dielectric material, or a combination of the foregoing. In further embodiments, the upper conductive via 220 and the second upper conductive wire 222 may, for example, respectively be or comprise copper, aluminum, titanium nitride, tantalum nitride, tungsten, ruthenium, another conductive material, or any combination of the foregoing.

Figure 25:
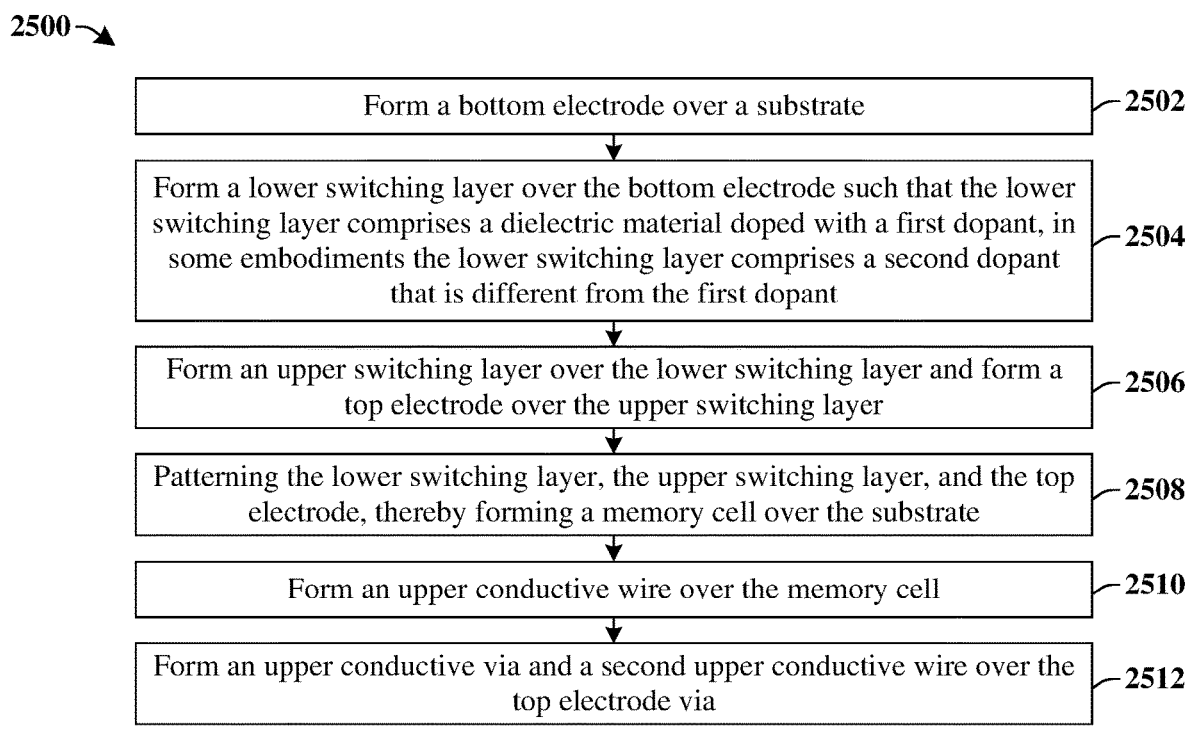
FIG. 25 illustrates a flowchart according to some embodiments of a method of forming a memory cell with a data storage structure having a lower switching layer doped with one or more dopants.

FIG. 25 illustrates a method 2500 for forming a memory device including a memory cell with a data storage structure having a lower switching layer doped with one or more dopants according to the present disclosure. Although the method 2500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2502, a bottom electrode is formed over a substrate. FIG. 7 illustrates a cross-sectional view 700 corresponding to some embodiments of act 2502. FIGS. 16 and 17 illustrate cross-sectional views 1600 and 1700 corresponding to some alternative embodiments of act 2502.

At act 2504, a lower switching layer is formed over the bottom electrode such that the lower switching layer comprises a dielectric material doped with a first dopant. In some embodiments, the lower switching layer further comprises a second dopant that is different from the first dopant. FIGS. 8A and 8B illustrate cross-sectional views 800a and 800b corresponding to some embodiments of act 2504. FIG. 9 illustrates the cross-sectional view 900 corresponding to an alternative embodiment of act 2504. Further, FIGS. 18A and 18B illustrate cross-sectional views 1800a and 1800b corresponding to some further embodiments of act 2504. Furthermore, FIG. 19 illustrates the cross-sectional view 1900 corresponding to yet another alternative embodiment of act 2504.

At act 2506, an upper switching layer is formed over the lower switching layer, and a top electrode is formed over the upper switching layer. FIG. 10 illustrates the cross-sectional view 1000 corresponding to some embodiments of act 2506. FIG. 20 illustrates the cross-sectional view 2000 corresponding to some alternative embodiments of act 2506.

At act 2508, the lower switching layer, the upper switching layer, and the top electrode are patterned, thereby forming a memory cell over the substrate. FIG. 11 illustrates the cross-sectional view 1100 corresponding to some embodiments of act 2508. FIG. 21 illustrates the cross-sectional view 2100 corresponding to some alternative embodiments of act 2508.

At act 2510, an upper conductive wire is formed over the memory cell. FIG. 13 illustrates the cross-sectional view 1300 corresponding to some embodiments of act 2510. FIG. 23 illustrates the cross-sectional view 2300 corresponding to some alternative embodiments of act 2510.

At act 2512, an upper conductive via and a second upper conductive wire are formed over the upper conductive wire. FIG. 14 illustrates the cross-sectional view 1400 corresponding to some embodiments of act 2512. FIG. 24 illustrates the cross-sectional view 2400 corresponding to some alternative embodiments of act 2512.

Accordingly, in some embodiments, the present disclosure relates to a memory cell comprising a top electrode, a bottom electrode, and a data storage structure disposed between the top and bottom electrodes, where the data storage structure comprises a lower switching layer comprising a dielectric material doped with a first dopant.

In some embodiments, the present application provides a memory device including a substrate; a bottom electrode overlying the substrate; a top electrode overlying the bottom electrode; and a data storage structure disposed between the top and bottom electrodes, wherein the data storage structure includes a lower switching layer overlying the bottom electrode, and an upper switching layer overlying the lower switching layer, wherein the lower switching layer comprises a dielectric material doped with a first dopant. In an embodiment, the lower switching layer is further doped with a second dopant that is different from the first dopant. In an embodiment, the first dopant comprises hydrogen and the second dopant comprises nitrogen. In an embodiment, the lower switching layer comprises a first atomic percentage of the first dopant and a second atomic percentage of the second dopant, wherein the second atomic percentage is greater than the first atomic percentage. In an embodiment, the first atomic percentage is greater than an atomic percentage of the first dopant within the upper switching layer, and the second atomic percentage is greater than an atomic percentage of the second dopant within the upper switching layer. In an embodiment, the memory device is configured to switch between a high resistance state and a low resistance state; when in the high resistance state, an intrinsic conductive filament is disposed within the lower switching layer, the intrinsic conductive filament having a bottom surface in contact with a top surface of the top electrode and having a top surface spaced apart from the top electrode by the upper switching layer; and when in the low resistance state, the intrinsic conductive filament remains disposed within the lower switching layer and an upper conductive filament is formed to extend through the upper switching layer from the top surface of the intrinsic conductive filament to a top surface of the upper switching layer. In an embodiment, a width of the intrinsic conductive filament is less than a width of the upper conductive filament. In an embodiment, a thickness of the lower switching layer is less than a thickness of the upper switching layer. In an embodiment, the upper switching layer comprises the dielectric material and the upper switching layer is devoid of the first dopant.

In some embodiments, the present application provides an integrated chip including a substrate; a lower conductive wire overlying the substrate; an upper conductive wire overlying the lower conductive wire; and a resistive random access memory (RRAM) cell disposed between the lower conductive wire and the upper conductive wire, wherein the RRAM cell includes a capping layer overlying the lower conductive wire, a bottom electrode underlying the capping layer, a lower switching layer overlying the bottom electrode, and an upper switching layer disposed between the lower switching layer and the capping layer, wherein the lower and upper switching layers respectively comprise a dielectric material, wherein the lower switching layer is co-doped with a first dopant and a second dopant, and wherein the first dopant is different than the second dopant. In an embodiment, an atomic percentage of the first and second dopants within the lower switching layer is greater than an atomic percentage of the first and second dopants within the upper switching layer. In an embodiment, a concentration of the first dopant continuously increases from a top surface of the lower switching layer to a first point below the top surface of the lower switching layer, wherein the concentration of the first dopant continuously decreases from the first point in a direction towards a bottom surface of the lower switching layer. In an embodiment, a distance between the first point and the top surface of the lower switching layer is less than a distance between the first point and the bottom surface of the lower switching layer. In an embodiment, the integrated chip further includes an etch stop layer overlying the lower conductive wire, wherein the bottom electrode is disposed within a recess defined by the etch stop layer; and wherein the lower switching layer comprises a middle region directly over the lower conductive wire and a peripheral region that is laterally offset from the recess, wherein a lower surface of the middle region is disposed below a lower surface of the peripheral region. In an embodiment, the lower surface of the middle region is disposed below an upper surface of the etch stop layer. In an embodiment, a sidewall of the lower switching layer is spaced laterally between an outer sidewall of the bottom electrode and an outer sidewall of the capping layer.

In some embodiments, the present application provides a method for forming a memory device, the method includes forming a bottom electrode over a substrate; forming a lower switching layer over the bottom electrode such that the lower switching layer comprises a dielectric material doped with a first dopant; depositing an upper switching layer over the lower switching layer such that an atomic percentage of the first dopant within the upper switching layer is less than an atomic percentage of the first dopant within the lower switching later; forming a top electrode over the upper switching layer; and patterning the lower switching layer, the upper switching layer, and the top electrode, thereby forming a memory cell. In an embodiment, forming the lower switching layer includes depositing a lower undoped switching layer over the bottom electrode, wherein the lower undoped switching layer comprises the dielectric material; and doping the lower undoped switching layer with the first dopant and a second dopant that is different than the first dopant, thereby forming the lower switching layer over the bottom electrode. In an embodiment, forming the lower switching layer includes depositing the dielectric material over the bottom electrode while in-situ co-doping the dielectric material with the first dopant and a second dopant that is different than the first dopant. In an embodiment, after forming the lower switching layer and before forming the upper switching layer, one or more intrinsic conductive filaments extend from a bottom surface of the lower switching layer to a top surface of the lower switching layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
    forming a bottom electrode over a substrate;
    forming a first switching layer on the bottom electrode, wherein the first switching layer comprises a dielectric material doped with a first dopant, wherein a concentration of the first dopant increases from a top surface of the first switching layer to a first point below the top surface of the first switching layer; and
    forming a second switching layer over the first switching layer, wherein an atomic percentage of the first dopant in the second switching layer is less than an atomic percentage of the first dopant in the first switching layer; and
    forming a top electrode over the second switching layer.

2. The method of claim 1, wherein the first dopant comprises hydrogen.

3. The method of claim 2, wherein the atomic percentage of the first dopant in the first switching layer is within a range of about 1.5 percent to about 30 percent.

4. The method of claim 1, wherein forming the first switching layer comprises depositing the dielectric material over the bottom electrode, performing a doping process on the dielectric material, and performing a thermal anneal process.

5. The method of claim 4, wherein the dielectric material is deposited by a chemical vapor deposition (CVD) process, a physical vapor deposition (PVD) process, or an atomic layer deposition (ALD) process.

6. The method of claim 1, wherein before forming the second switching layer the first switching layer comprises a plurality of conductive filaments.

7. The method of claim 1, wherein the first switching layer further comprises a second dopant with an atomic percentage different from the atomic percentage of the first dopant in the first switching layer.

8. A method for forming an integrated chip, the method comprising:
    forming a bottom electrode over a substrate;
    forming a first switching layer over the bottom electrode, wherein the first switching layer comprises one or more intrinsic conductive filaments that extend from a bottom surface of the first switching layer to a top surface of the first switching layer;
    forming a second switching layer on the top surface of the first switching layer, wherein the one or more intrinsic conductive filaments are disposed in the first switching layer before forming the second switching layer; and
    forming a top electrode over the second switching layer.

9. The method of claim 8, wherein the first switching layer is formed to a first thickness and the second switching layer is formed to a second thickness greater than the first thickness.

10. The method of claim 9, wherein the first thickness is within a range of about 1.5 nm to about 2 nm and the second thickness is within a range of about 2 nm to about 3 nm.

11. The method of claim 8, wherein the second switching layer is undoped.

12. The method of claim 8, further comprising:
forming a capping layer between the second switching layer and the top electrode, wherein sidewalls of the capping layer are aligned with sidewalls of the second switching layer.

13. The method of claim 8, wherein the first switching layer is co-doped with a first dopant and a second dopant.

14. The method of claim 8, wherein an upper conductive path is formable and dissolvable in the second switching layer.

15. A method for forming a memory device, the method comprising:
forming a bottom electrode over a substrate;
forming a lower switching layer over the bottom electrode such that the lower switching layer comprises a dielectric material co-doped with a first dopant and a second dopant, wherein a first atomic percentage of the first dopant in the lower switching layer is different from a second atomic percentage of the second dopant in the lower switching layer;
depositing an upper switching layer over the lower switching layer;
forming a top electrode over the upper switching layer; and
patterning the lower switching layer, the upper switching layer, and the top electrode, thereby forming a memory cell.

16. The method of claim 15, wherein forming the lower switching layer includes:
depositing a lower undoped switching layer over the bottom electrode, wherein the lower undoped switching layer comprises the dielectric material; and
doping the lower undoped switching layer with the first dopant and the second dopant, thereby forming the lower switching layer over the bottom electrode.

17. The method of claim 15, wherein after forming the lower switching layer and before forming the upper switching layer, one or more intrinsic conductive filaments extend from a bottom surface of the lower switching layer to a top surface of the lower switching layer.

18. The method of claim 15, wherein outer sidewalls of the lower switching layer are aligned with outer sidewalls of the upper switching layer.

19. The method of claim 15, wherein a concentration of the first dopant and/or the second dopant continuously increases from a top surface of the lower switching layer to a first point below the top surface of the lower switching layer.

20. The method of claim 19, wherein the concentration of the first dopant and/or the second dopant continuously decreases from the first point in a direction towards a bottom surface of the lower switching layer.

* * * * *